United States Patent
Fukuda

(10) Patent No.: US 8,581,623 B2
(45) Date of Patent: Nov. 12, 2013

(54) LOOKUP TABLE, SEMICONDUCTOR INTEGRATED CIRCUIT, METHOD FOR MAKING LOOKUP TABLE AND METHOD FOR MAKING SEMICONDUCTOR INTEGRATED CIRCUIT

(75) Inventor: Hideto Fukuda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/713,270

(22) Filed: Feb. 26, 2010

(65) Prior Publication Data

US 2010/0225354 A1 Sep. 9, 2010

(30) Foreign Application Priority Data

Mar. 6, 2009 (JP) ................................ 2009-054147

(51) Int. Cl.
*H03K 19/173* (2006.01)
(52) U.S. Cl.
USPC .................................. 326/38; 326/41; 326/47
(58) Field of Classification Search
USPC .............. 326/37–41, 44–47, 49–50, 101–103
See application file for complete search history.

(56) References Cited

U.S. PATENT DOCUMENTS

| | | | |
|---|---|---|---|
| 7,243,329 B2 | 7/2007 | Chua et al. | |
| 7,425,720 B2 | 9/2008 | Kaeriyama et al. | |
| 7,432,736 B2 | 10/2008 | Gliese | |
| 2004/0196680 A1 | 10/2004 | Kang | |
| 2005/0045919 A1* | 3/2005 | Kaeriyama et al. | 257/211 |
| 2005/0083082 A1* | 4/2005 | Olofsson | 326/95 |
| 2006/0279329 A1* | 12/2006 | Kamp et al. | 326/41 |

FOREIGN PATENT DOCUMENTS

| | | |
|---|---|---|
| JP | 63-132473 | 6/1988 |
| JP | 04-209397 | 7/1992 |
| JP | 2004-312701 | 11/2004 |
| JP | 2005-101535 | 4/2005 |
| JP | 2006-020329 | 1/2006 |
| JP | 2007-528167 | 10/2007 |
| JP | 2008-512850 | 4/2008 |
| JP | 2009-043399 | 2/2009 |
| WO | 2006/014849 | 2/2006 |

OTHER PUBLICATIONS

Office Action of Japanese Patent Application No. 2009-054147 dated Aug. 27, 2013.

* cited by examiner

*Primary Examiner* — Jany Richardson
(74) *Attorney, Agent, or Firm* — Staas & Halsey LLP

(57) ABSTRACT

A lookup table includes a single via layer having $2^N$ via insertion portions corresponding to $2^N$ input patterns provided from N input terminals; and a via inserted into at least one of the via insertion portions, the via connecting the input terminal and an output terminal.

8 Claims, 23 Drawing Sheets

| INPUT | | | | | | OUTPUT | |
|---|---|---|---|---|---|---|---|
| PCA | EX_LUT_IN | XADEX | AD2 | AD1 | AD0 | LUTOUT | CLBOUT |
| 0 | 0 | 0 | 0 | 0 | 0 | 0 | 0 |
| 0 | 0 | 0 | 0 | 0 | 1 | 1 | 0 |
| 0 | 0 | 0 | 0 | 1 | 0 | 1 | 0 |
| 0 | 0 | 0 | 0 | 1 | 1 | 1 | 0 |
| 0 | 0 | 0 | 1 | 0 | 0 | 1 | 0 |
| 0 | 0 | 0 | 1 | 0 | 1 | 0 | 0 |
| 0 | 0 | 0 | 1 | 1 | 0 | 1 | 0 |
| 0 | 0 | 0 | 1 | 1 | 1 | 1 | 0 |
| 0 | 0 | 1 | 0 | 0 | 0 | 0 | 0 |
| 0 | 0 | 1 | 0 | 0 | 1 | 1 | 1 |
| 0 | 0 | 1 | 0 | 1 | 0 | 1 | 1 |
| 0 | 0 | 1 | 0 | 1 | 1 | 1 | 1 |
| 0 | 0 | 1 | 1 | 0 | 0 | 1 | 1 |
| 0 | 0 | 1 | 1 | 0 | 1 | 0 | 0 |
| 0 | 0 | 1 | 1 | 1 | 0 | 1 | 1 |
| 0 | 0 | 1 | 1 | 1 | 1 | 1 | 1 |

FIG. 11  1100

| INPUT | | | | | | OUTPUT | |
|---|---|---|---|---|---|---|---|
| PCA | EX_LUT_IN | XADEX | AD2 | AD1 | AD0 | LUTOUT | CLBOUT |
| 0 | 0 | 0 | 0 | 0 | 0 | 1 | 0 |
| 0 | 0 | 0 | 0 | 0 | 1 | 1 | 0 |
| 0 | 0 | 0 | 0 | 1 | 0 | 1 | 0 |
| 0 | 0 | 0 | 0 | 1 | 1 | 0 | 0 |
| 0 | 0 | 0 | 1 | 0 | 0 | 0 | 0 |
| 0 | 0 | 0 | 1 | 0 | 1 | 1 | 0 |
| 0 | 0 | 0 | 1 | 1 | 0 | 1 | 0 |
| 0 | 0 | 0 | 1 | 1 | 1 | 0 | 0 |
| 0 | 0 | 1 | 0 | 0 | 0 | 1 | 0 |
| 0 | 0 | 1 | 0 | 0 | 1 | 1 | 0 |
| 0 | 0 | 1 | 0 | 1 | 0 | 1 | 0 |
| 0 | 0 | 1 | 0 | 1 | 1 | 0 | 1 |
| 0 | 0 | 1 | 1 | 0 | 0 | 0 | 1 |
| 0 | 0 | 1 | 1 | 0 | 1 | 1 | 0 |
| 0 | 0 | 1 | 1 | 1 | 0 | 1 | 0 |
| 0 | 0 | 1 | 1 | 1 | 1 | 0 | 1 |

| INPUT | | | | | | | OUTPUT | |
|---|---|---|---|---|---|---|---|---|
| PCA_1 | PCA_2 | EX_LUT_IN2 | AD3 | AD2 | AD1 | AD0 | CLBOUT2 (EX_LUT_IN1) | CLBOUT1 |
| 0 | 0 | 0 | 0 | 0 | 0 | 0 | LUTOUT2 | CLBOUT2 |
| 0 | 0 | 0 | 0 | 0 | 0 | 1 | LUTOUT2 | CLBOUT2 |
| 0 | 0 | 0 | 0 | 0 | 1 | 0 | LUTOUT2 | CLBOUT2 |
| 0 | 0 | 0 | 0 | 0 | 1 | 1 | LUTOUT2 | CLBOUT2 |
| 0 | 0 | 0 | 0 | 1 | 0 | 0 | LUTOUT2 | CLBOUT2 |
| 0 | 0 | 0 | 0 | 1 | 0 | 1 | LUTOUT2 | CLBOUT2 |
| 0 | 0 | 0 | 0 | 1 | 1 | 0 | LUTOUT2 | CLBOUT2 |
| 0 | 0 | 0 | 0 | 1 | 1 | 1 | LUTOUT2 | CLBOUT2 |
| 0 | 0 | 0 | 1 | 0 | 0 | 0 | 0 | LUTOUT1 |
| 0 | 0 | 0 | 1 | 0 | 0 | 1 | 0 | LUTOUT1 |
| 0 | 0 | 0 | 1 | 0 | 1 | 0 | 0 | LUTOUT1 |
| 0 | 0 | 0 | 1 | 0 | 1 | 1 | 0 | LUTOUT1 |
| 0 | 0 | 0 | 1 | 1 | 0 | 0 | 0 | LUTOUT1 |
| 0 | 0 | 0 | 1 | 1 | 0 | 1 | 0 | LUTOUT1 |
| 0 | 0 | 0 | 1 | 1 | 1 | 0 | 0 | LUTOUT1 |
| 0 | 0 | 0 | 1 | 1 | 1 | 1 | 0 | LUTOUT1 |

LOOKUP TABLE, SEMICONDUCTOR INTEGRATED CIRCUIT, METHOD FOR MAKING LOOKUP TABLE AND METHOD FOR MAKING SEMICONDUCTOR INTEGRATED CIRCUIT

CROSS REFERENCE TO RELATED APPLICATION

This application is based upon and claims the benefit of priority from the prior Japanese Patent Application NO. 2009-054147 filed on Mar. 6, 2009, the entire contents of which are incorporated herein by reference.

FIELD

The embodiment discussed herein are related to a lookup table for which a change of a single via layer may change logic, a semiconductor integrated circuit, a method for making a lookup table and a method for making a semiconductor integrated circuit.

BACKGROUND

In recent years, semiconductor integrated circuits dedicated to specific functions and objects for limited fields and applications, such as ASSP (Application Specific Standard Produce), are increasingly in demand. As various kinds of semiconductor integrated circuits are developed in order to be dedicated to specific functions and objects, such semiconductor integrated circuits have consequently lots of varieties. Further, as some varieties may possibly be produced in a small amount, reducing cost for new development may be requested. Thus, an effort made as much as possible to develop a semiconductor integrated circuits having different logic without a significant change of an existing process may contribute to reducing a period of time and the cost for the development.

Thus, use of writable semiconductor integrated circuits is known as a technology for reducing a period of time for development. For instance, an FPGA (Field Programmable Gate Array) (refer to, e.g., Japanese Laid-Open Patent Publication No. 2006-20329) and a PLD (Programmable Logic Device) are listed as writable semiconductor integrated circuits.

The FPGA is constituted by a lookup table (called LUT (Look Up Table) hereafter), a CLB (Configurable Logic Blocks) including a D-FF (D-Flip Flop), and a switch matrix interconnecting a plurality of the CLBs. The FPGA uses an SRAM (Static Random Access Memory) so as to hold content of the LUT, an operation mode of the D-FF and a state of the switch matrix.

Meanwhile, the PLD uses an EEPROM (Electrically Erasable And Programmable Read Only Memory) instead of an SRAM. Further, a technology for using a resistor as a switch instead of a storage element such as an SRAM or an EEPROM is known (refer to, e.g., Japanese Laid-Open Patent Publication No. 2005-101535).

Further, use of a Structured ASIC (Application Specific Integrated Circuit) is known as a technology for reducing a period of time for development. The Structured ASIC is an ASIC constituted by a plurality of kinds of circuits integrated in advance (refer to, e.g., Japanese Laid-Open Patent Publication No. 2007-528167).

In a case where a writable semiconductor integrated circuit is used, however, according to the technology for using a resistor as a switch, e.g., a special making process is added to a via so that the resistor is formed. In which via layer the resistor is formed is indefinite, though. Thus, there is a problem in that the special making process is requested for a process for making a plurality of via layers, causing the making process to be complicated.

Further, in a case where a writable semiconductor integrated circuit is used, as a process for writing implemented circuit data into the semiconductor integrated circuit is requested, there is a problem in that the cost increases depending on a produced amount.

Then, e.g., as using an SRAM as described above, the FPGA has a problem of a lower degree of integration and lower speed than the ASIC and so on. As using an EEPROM similarly as the FPGA, the PLD has a problem of a low degree of integration and low speed. Further, the FPGA and the PLD have a problem of requiring a large area and a manufacturing cost owing to the low degree of integration.

Further, the Structured ASIC has a problem of including a plurality of circuits which are not practically used in a plurality of kinds of circuits which are integrated in advance. Moreover, there is a problem in that development of a semiconductor integrated circuit of different logic causes a change of three to four wiring layers and via layers, and thus the cost increases.

SUMMARY

According to an aspect of the embodiments, a lookup table disclosed herein include: a single via layer having $2^N$ via insertion portions corresponding to $2^N$ input patterns provided from N input terminals, and a via inserted into at least one of the via insertion portions and connecting input and output terminals.

The object and advantages of the embodiments will be realized and attained by means of the elements and combinations particularly pointed out in the claims.

It is to be understood that both the foregoing general description and the following detailed description and are exemplary and explanatory and are not

BRIEF DESCRIPTION OF DRAWINGS

FIG. 8 illustrates an input/output example including lots of input patterns causing CLBOUT to be 1;

FIG. 11 illustrates an input/output example including lots of input patterns causing CLBOUT to be 0;

FIG. 15 illustrates a truth table where a plurality of the CLBs is connected;

DESCRIPTION OF THE EMBODIMENTS

A preferable embodiment of the lookup table, the semiconductor integrated circuit, the method for making the lookup table and the method for making the semiconductor integrated circuit will be explained below in detail with reference to the drawings. According to the embodiment, the semiconductor integrated circuit is provided with a single via layer. The via layer includes a via insertion portion of an LUT, a via insertion portion of a CLB having the LUT and a group of circuit elements provided outside the LUT, and a via insertion portion of a switch matrix. The LUT, the CLB and the semiconductor integrated circuit will be explained hereafter as first, second and third embodiments, respectively.

First Embodiment

According to the first embodiment, the LUT is provided with a single via layer. The via layer has $2^N$ via insertion portions corresponding to $2^N$ input patterns provided to N input terminals of the LUT. Further, a via is inserted into at least selected one of the $2^N$ via insertion portions.

Figure 1:
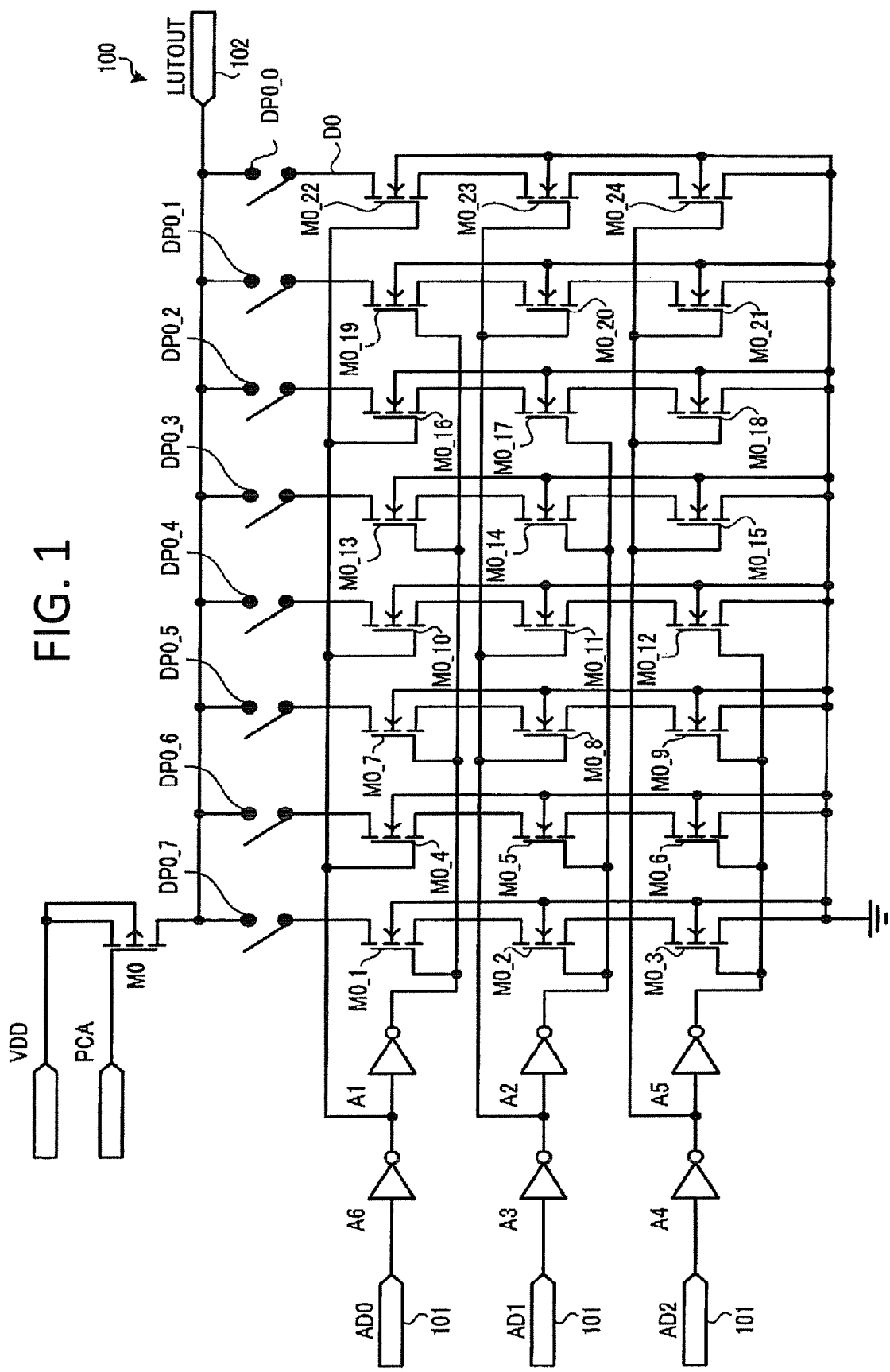
FIG. 1 illustrates an example of an LUT of a first embodiment.

FIG. 1 illustrates an example of the LUT of the first embodiment. An LUT 100 is constituted by three input terminals 101 for being provided with an input pattern, an output terminal 102, a precharge circuit M0, elements M0_1-M0_24 forming a selection circuit corresponding to eight input patterns, via insertion portions DP0_0-DP0_7 and inverters A1-A6.

Symbols DP0_0-DP0_7 indicate via insertion portions of a single via layer, and are drawn like switches for easy comprehension. A closed switch indicates that a via is inserted, and an open switch indicates that no via is inserted. Symbols M0_1-M0_24 indicate N-channel MOS (called NMOS hereafter) transistors.

Symbols AD0-AD2 indicate input terminals 101 for being provided with an input pattern. Symbols PCA and ADD indicate input terminals of the precharge circuit. Further, a symbol LUTOUT indicates the output terminal 102. Some NMOS transistors corresponding to an input pattern are turned on, and a value "1" or "0" is output to LUTOUT. A set of inputs, e.g., AD2=0, AD1=0 and AD0=0 is an input pattern.

If, e.g., the LUT 100 is provided with inputs PCA=0, AD0=0, AD1=0 and AD2=0, the NMOS transistors M0_24, M0_23 and M0_22 are turned on, and a portion indicated by D0 is given a level "0" (VSS). Further, if a via is inserted into DP0_0, a level "0" (VSS) is output to LUTOUT. If no via is inserted into DP0_0, the precharge circuit provides LUTOUT with a level "1" (VDD).

Thus, NMOS transistors corresponding to an input pattern are turned on, and a level "0" (VSS) or "1" is output to LUTOUT depending on whether a via is inserted or not into a via insertion portion. Upon letting the number of the input terminals be N, the number of the NMOS transistors of the selection circuit is given by a following equation (1).

$$k=2^N \times N \quad (1)$$

where k is the number of the NMOS transistors.

If there are seven input terminals 101, e.g., the number of the NMOS transistors is 896 in accordance with the above equation (1). Thus, the LUT is implemented by a simple configuration. Then, an example for which the NMOS transistors are optimized in the LUT 100 will be shown.

Figure 2:
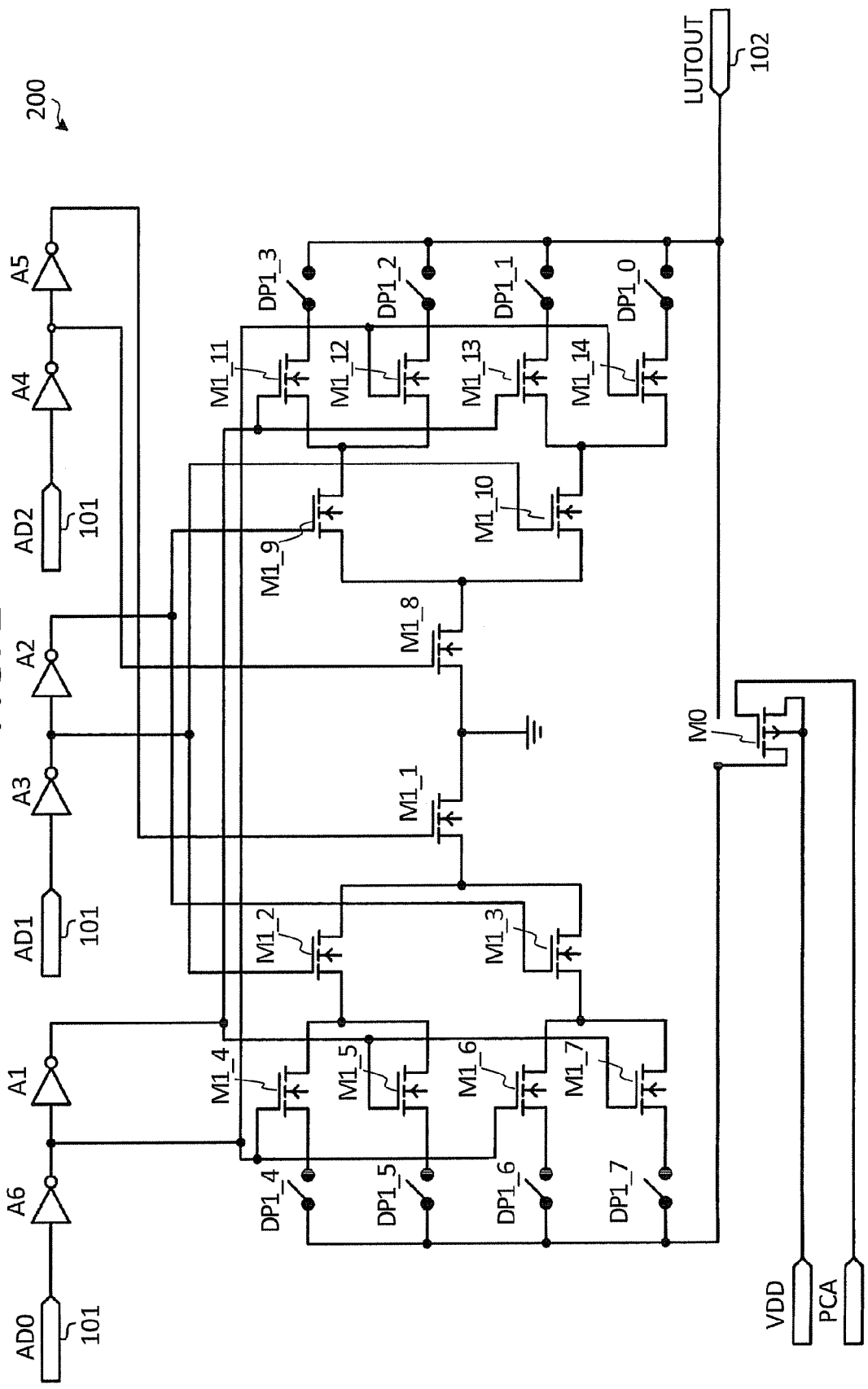
FIG. 2 illustrates an example of an optimized selection circuit of the LUT of the first embodiment.

FIG. 2 illustrates an example of an optimized selection circuit of the LUT of the first embodiment. An LUT 200 is constituted by three input terminals 101, an output terminal 102, a precharge circuit M0, NMOS transistors M1_1-M1_14 forming a selection circuit, via insertion portions DP1_0-DP1_7 and inverters A1-A6. Symbols DP1_0-DP1_7 indicate via insertion portions of a single via layer. The input terminals 101 and the output terminal 102 of the LUT 200 are same as those of the LUT 100.

The NMOS transistors M1_1-M1_14 form the selection circuit of the LUT 200. The LUT 200 is optimized so as to be formed by fewer NMOS transistors than the selection circuit of the LUT 100.

For instance, the NMOS transistors M0_3, M0_6, M0_9 and M0_12 in the LUT 100 shown in FIG. 1 are turned on if AD2=1. Further, the NMOS transistors M0_15, M0_18, M0_21 and M0_24 are turned on if AD2=0. Thus, the number NMOS transistors being turned on if AD2=1 is made one (M1_1), and the number of NMOS transistors being turned on if AD2=0 is made one (M1_8).

For instance, the LUT 200 is provided with an input pattern such as PCA=0, AD0=1, AD1=0 and AD2=1, the NMOS transistors M1_1, M1_2 and M1_5 are turned on. Further, if a via is inserted into DP1_5, a level "0" (VSS) is output to LUTOUT. If no via is inserted into DP1_5, the precharge circuit provides LUTOUT with a level "1" (VDD).

The number of the NMOS transistors are optimized, and is thereby reduced. Thus, an area of the LUT may be reduced. Hence, the cost may be reduced. Then, layout data of the LUT 200 will be explained with reference to FIG. 3.

Figure 3:
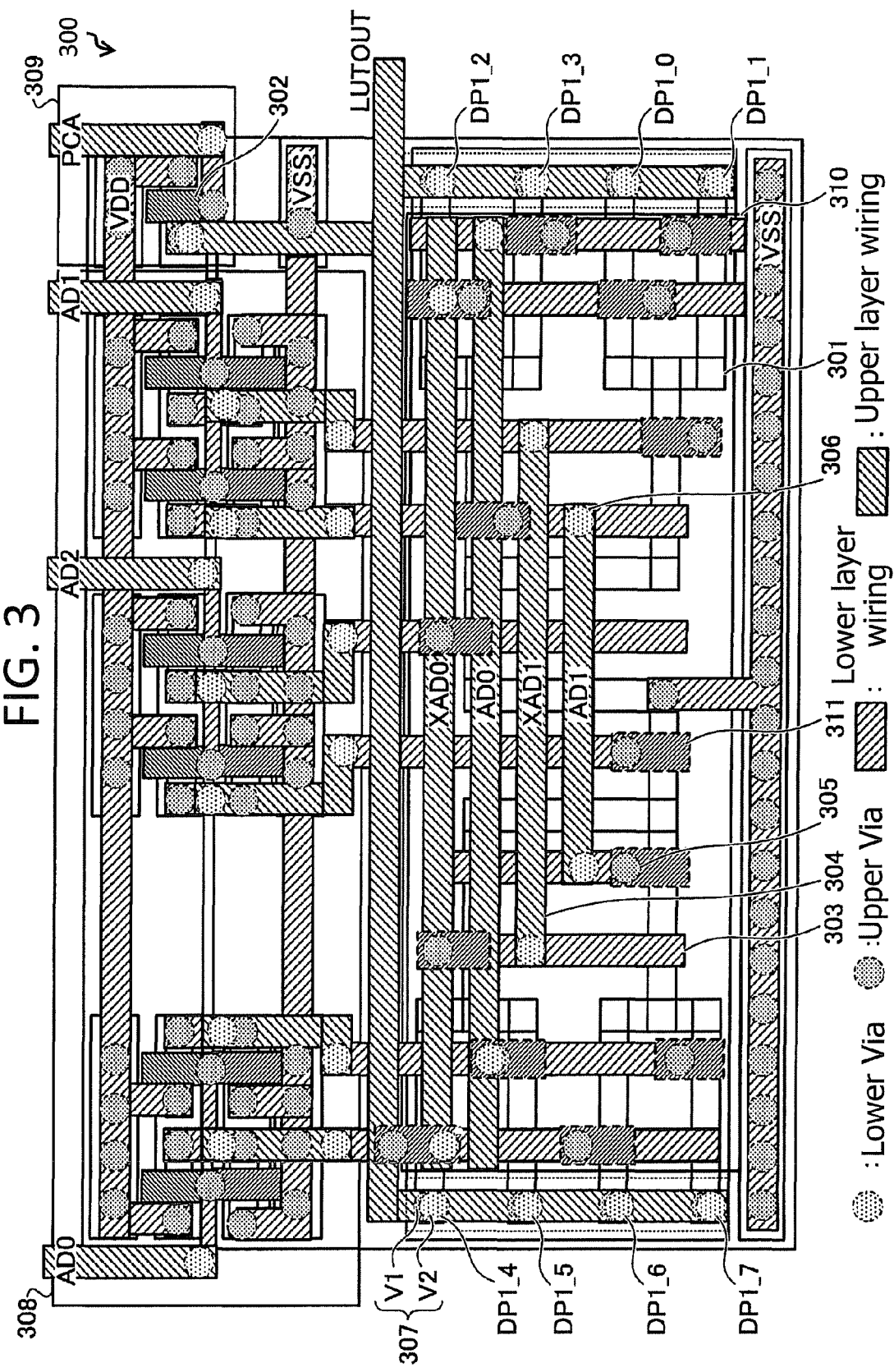
FIG. 3 illustrates layout data of an LUT.

FIG. 3 illustrates the layout data of the LUT 200. The layout data 300 is formed by a diffusion area 301, a Poly 302, a Poly 311, a lower layer wiring assembly 303, an upper layer wiring assembly 304, a via 305, a via 306 and a stack via 307.

As a matter of fact, the via 305 and the Poly 311 are on a layer lower than the lower layer wiring assembly 303, and the via 306 and the stack via 307 are on a layer lower than the upper layer wiring assembly 304. According to the layout data 300, however, they are arranged above the upper layer wiring assembly 304 for easy comprehension (as surrounded by a dotted line).

The stack via 307 is formed by a via V1 of a lower layer and a via V2 of an upper layer. According to the layout data 300, the via V2 of the stack via 307 and the via 306 are on a same via layer, and the via V1 of the stack via 307 and the via 305 are on a same via layer. The inverters A1-A6 in the LUT 200 are formed in an area 308. A precharge circuit is formed by the diffusion area 301 and the Poly 302 in an area 309. Fourteen NMOS transistors are formed by the diffusion area 301 and the Poly 311 in an area 310.

Further, the diffusion area 301 and the lower layer wiring assembly 303 are connected to each other through the via 305, so are the Poly 302 and the lower layer wiring assembly 303, and so are the Poly 311 and the lower layer wiring assembly 303. The lower layer wiring assembly 303 and the upper layer wiring assembly 304 are connected to each other through the via 306. Further, the via V2 of the stack via 307 is the via inserted into the via insertion portions DP1_0-DP1_7.

According to the layout data 300, the via insertion portions DP1_0-DP1_3 are arranged as forming a line in a direction of a single via layer plane on the basis of the arrangement of the NMOS transistors. Further, the via insertion portions DP1_4-DP1_7 are arranged as forming a line in a direction of a single via layer plane on the basis of the arrangement of the NMOS transistors.

If a via is formed by means of an electron beam lithography device, e.g., the via is drawn directly on a wafer on the basis of coordinate system data without a use of a mask. Thus, as at least a portion of V2 of the stack via 307 forms a line, the drawing process by means of the electron beam lithography device may be easily performed. In a making process, a single via layer may thereby be easily changed. Further, as the drawing process by means of the electron beam lithography device is made easy, the cost may be reduced. Then, an example of a connection of V2 of the stack via 307 is shown in FIG. 4.

Figure 4:
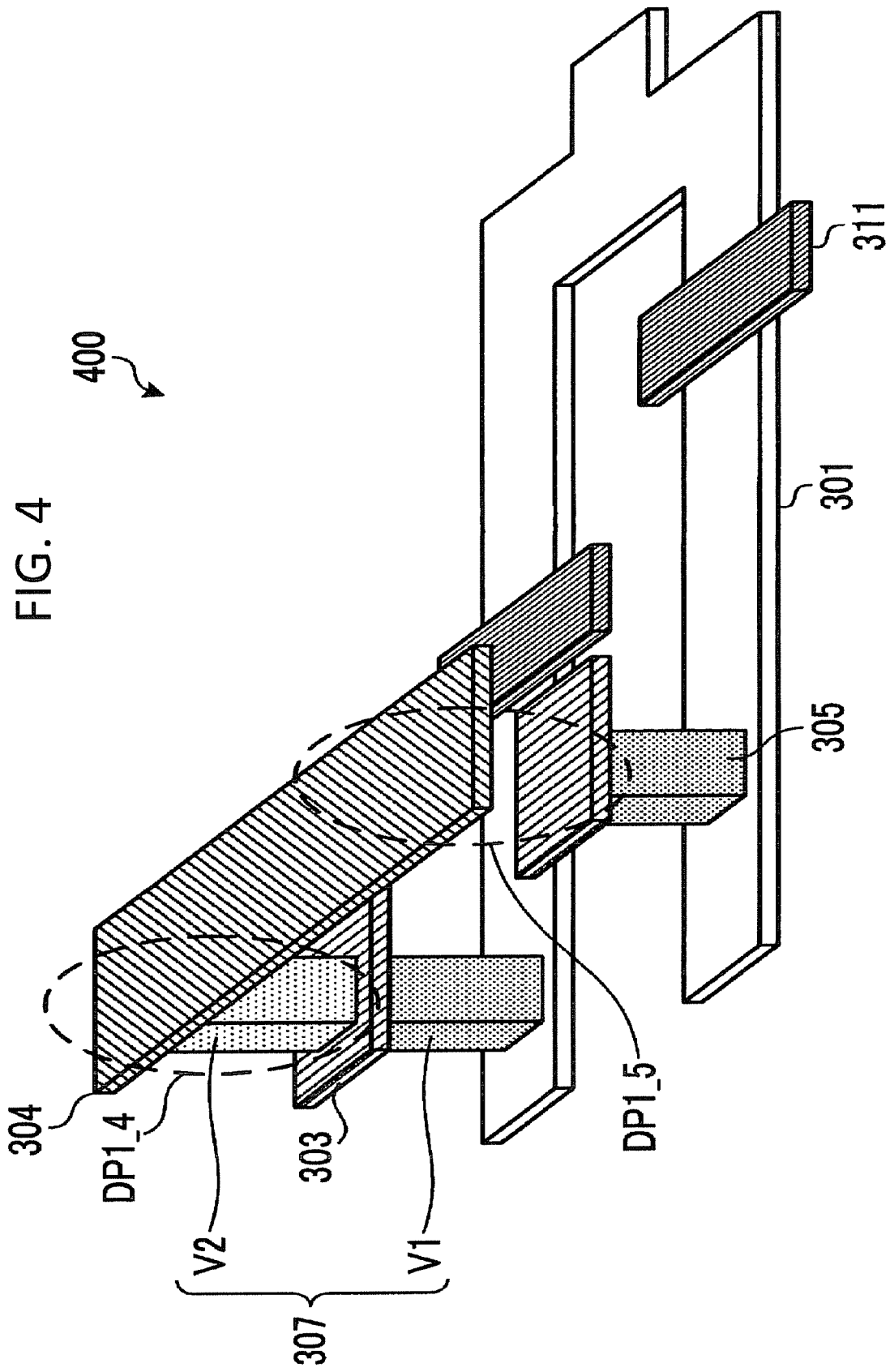
FIG. 4 illustrates an example for which V2 of a stack via is inserted into a via insertion portion.

FIG. 4 illustrates an example where V2 of the stack via 307 is inserted into a via insertion portion. A portion of the layout data 300 is shown in 3D as layout data 400. The via V2 is not inserted into DP1_5, and inserted into DP1_4. The upper layer wiring assembly 304 in the layout data 400 is LUTOUT. Thus, if an input pattern such as AD2=1, AD1=0 and AD0=0 is provided, a level "0" is output to LUTOUT. If an input pattern such as AD2=1, AD1=0 and AD0=1 is provided, a level "1" is output to LUTOUT. Then, an LUT having four input terminals 101 is shown in FIG. 5.

Figure 5:
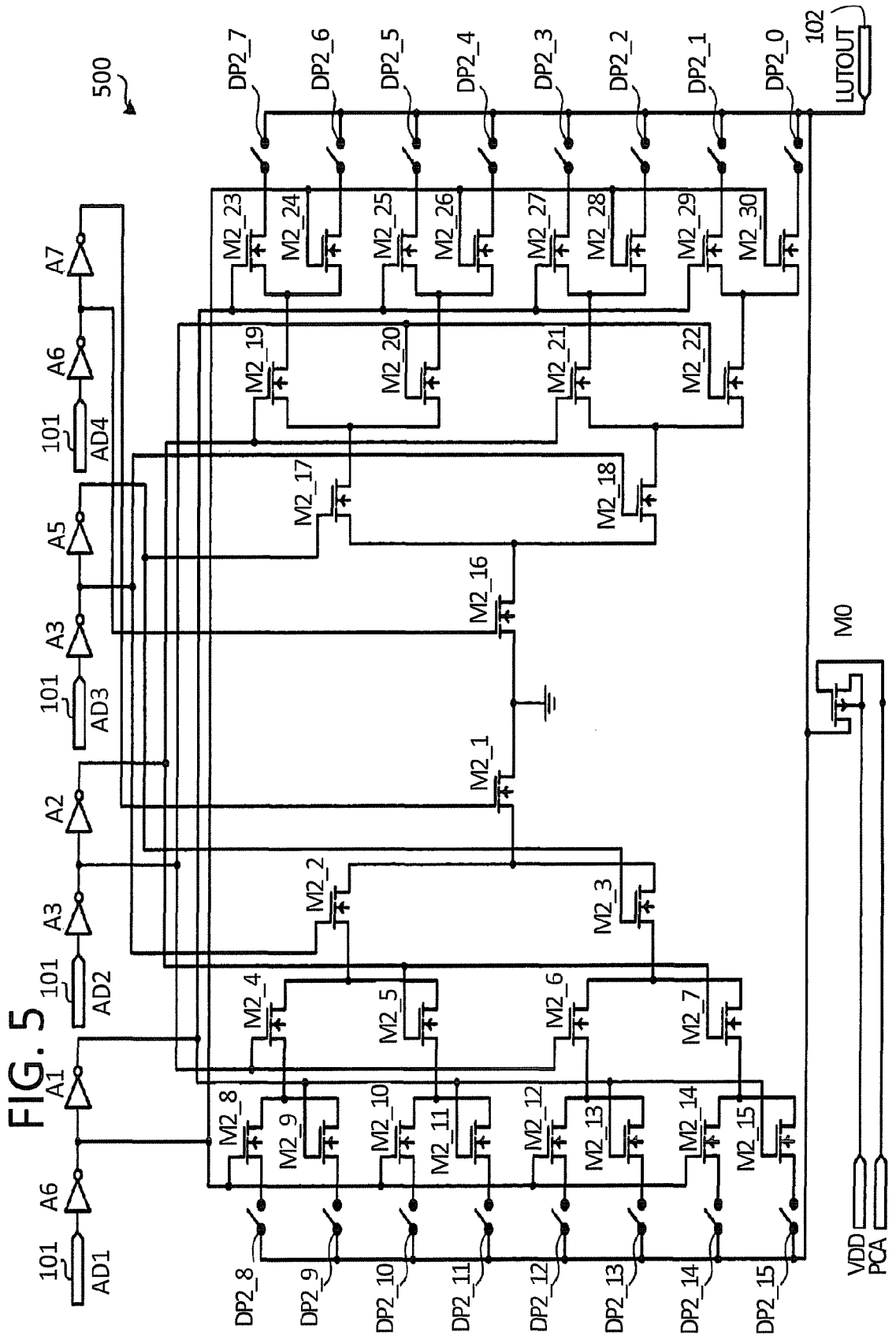
FIG. 5 illustrates an example of an LUT having four input terminals.

FIG. 5 illustrates an example of an LUT having four input terminals 101. An LUT 500 has four input terminals AD0-AD3. Symbols DP2_0-DP2_15 indicate via insertion portions of a single via layer.

Further, a selection circuit is constituted by NMOS transistors M2_1-M2_30. The number of the NMOS transistors constituting the selection circuits of the LUT 200 and the LUT 500 is calculated by a following equation (2).

$$m = \sum_{i=1}^{N} 2^i \quad (2)$$

where m is the number of the NMOS transistors.

For instance, the number of the NMOS transistors constituting a selection circuit of an LUT having seven input terminals 101 is 254 and 896 in accordance with the above equations (2) and (1), respectively. Thus, the selection circuit of the LUT having seven input terminals 101 is constituted by minimum 254 and maximum 896 NMOS transistors. A use of the selection circuit constituted by the optimized NMOS transistors may reduce an area of the LUT. Then, layout data of the LUT 500 is shown in FIG. 6.

Figure 6:
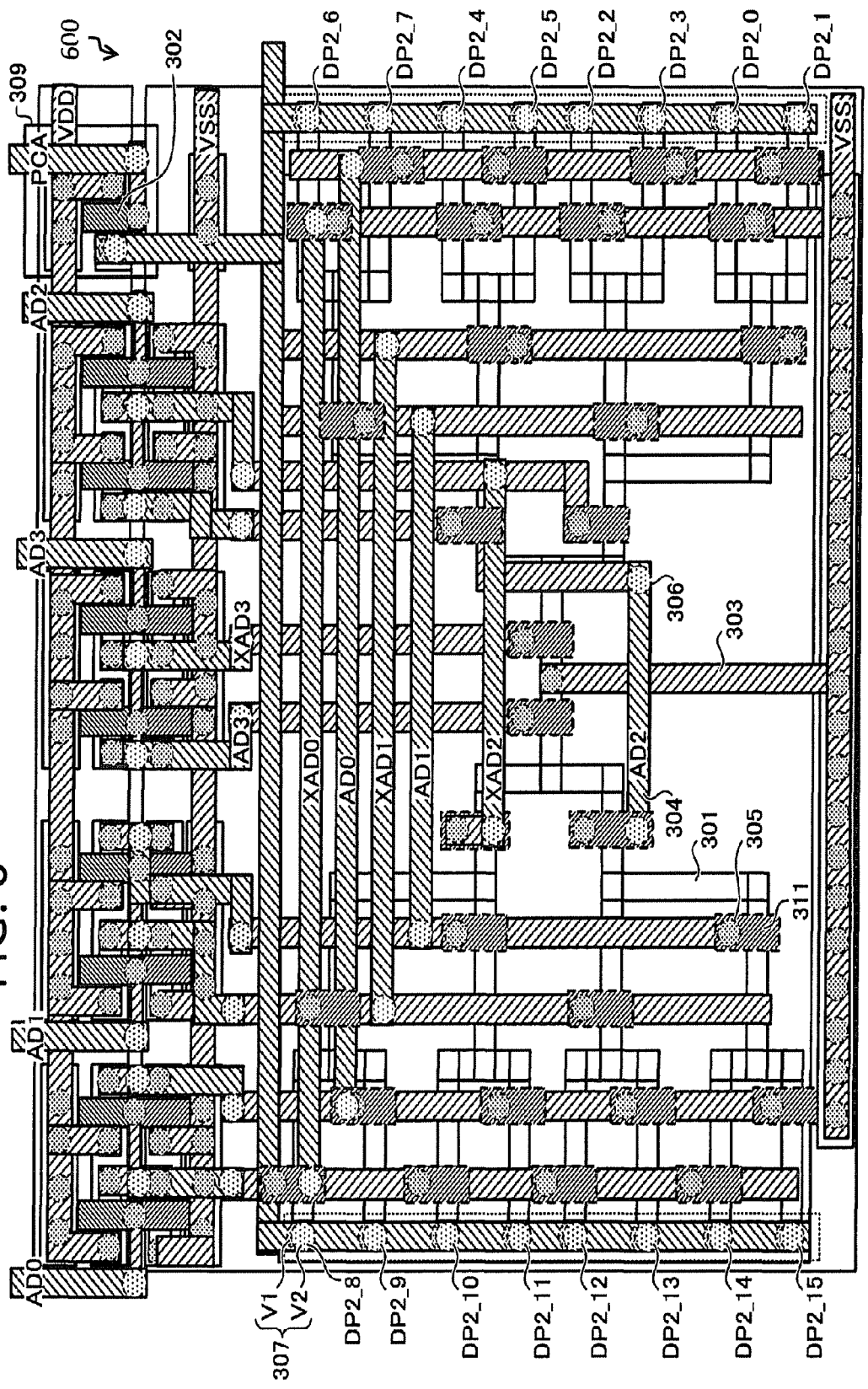
FIG. 6 illustrates layout data of an LUT.

FIG. 6 illustrates layout data of the LUT 500. Layout data 600 is formed by elements which are same as those of the layout data 300. Further, the via insertion portions DP2_0-DP2_7 are arranged as forming a line in a direction of a single via layer plane on the basis of the arrangement of the NMOS transistors. The via insertion portions DP2_8-DP2_15 are arranged as forming a line in a direction of a single via layer plane on the basis of the arrangement of the NMOS transistors. Thus, the via insertion portions are arranged as forming a line regardless of an increase of the input terminals 101, so that the insertion of the via into the single via layer may be easily changed in the making process.

According to the first embodiment, as a via is inserted into at least one of via insertion portions of a single via layer so that logic is determined, operation speed may be accelerated and a degree of integration may be enhanced. Further, at least a portion of the via insertion portions is arranged as forming a line so that whether a via is inserted or not may be easily changed, and that an LUT may be easily made.

Second Embodiment

According to a second embodiment, a CLB including the LUT of the first embodiment and a group of circuit elements provided outside the LUT is provided with a single via layer. The via layer has $2^N$ via insertion portions of the LUT of the first embodiment and via insertion portions of the group of circuit elements. Further, a via is inserted into selected one of the via insertion portions in the CLB.

Figure 7:
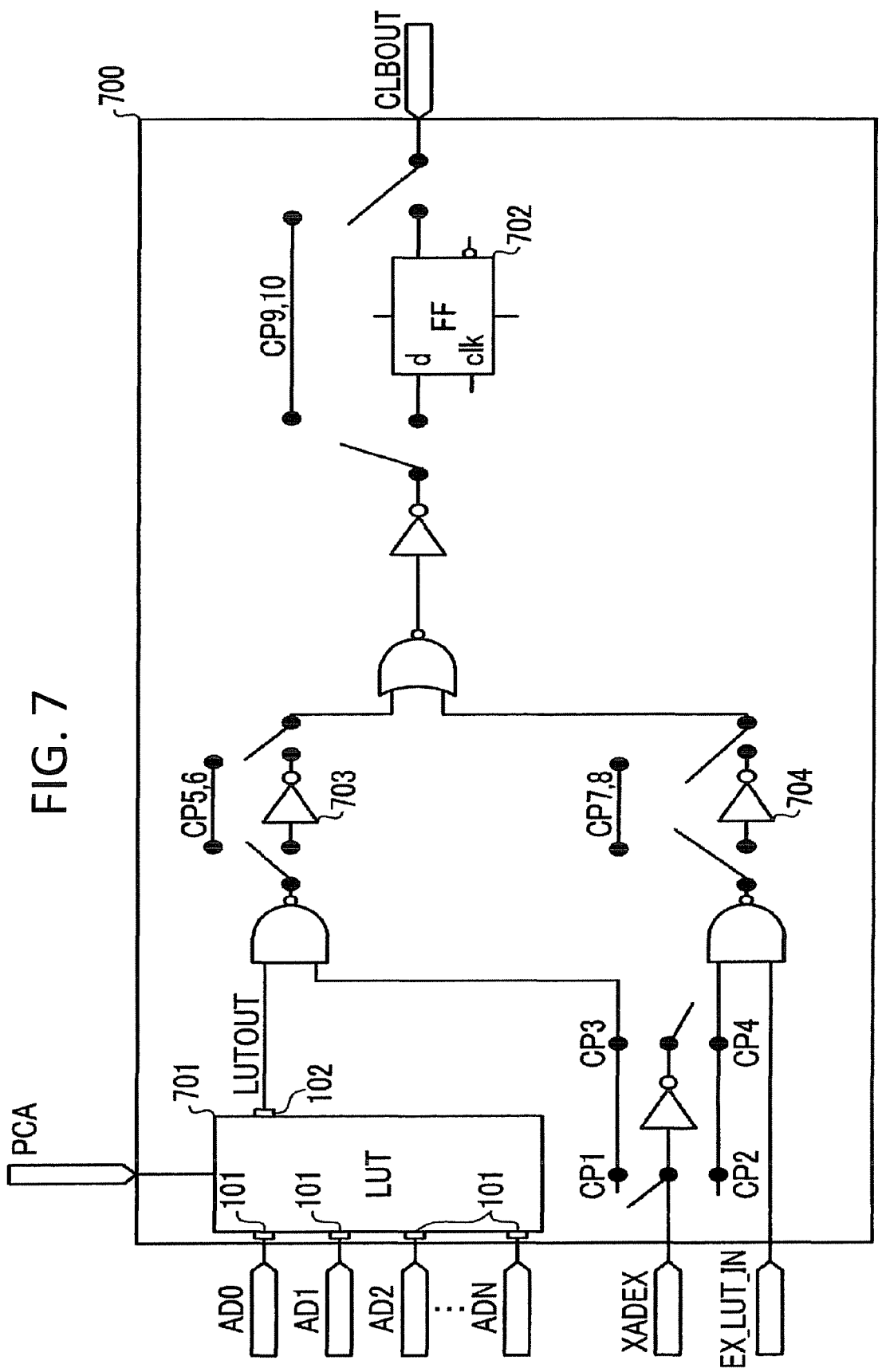
FIG. 7 illustrates a configuration of a CLB of a second embodiment.

FIG. 7 illustrates a configuration of the CLB of the second embodiment. A CLB 700 is constituted by an LUT 701, a group of circuit elements provided outside the LUT 701, and via insertion portions CP1-CP10. The groups of circuit elements are elements other than the LUT 701 in the CLB 700. The via insertion portions CP1-CP10 are via insertion portions in a single via layer, and are drawn like switches for easy comprehension. A closed switch indicates that a via is inserted, and an open switch indicates that no via is inserted.

Symbols AD0-ADN, XADEX, EX_LUT_IN and PCA indicate input terminals of the CLB 700. Further, a symbol CLBOUT indicates an output terminal of the CLB 700. The terminals AD0-ADN and XADEX are input terminals for providing the CLB 700 with an input pattern. The terminal PCA is an input to be used for a precharge circuit in the LUT 701.

The LUT 701 described above implements a circuit equivalent to a combination circuit, and a result of the circuit equivalent to a combination circuit is kept by a D-FF 702. The LUT 701 has input terminals 101 and an output terminal 102. If the number of the input terminals 101 is N, the LUT 701 forms a circuit equivalent to a combination circuit corresponding to $2^N$ input patterns as described above. The terminals AD0-ADN are input terminals for providing the N input terminals 101 with an input pattern.

Further, a plurality of the CLBs 700 is connected so that the number of the input terminals increases and so do the input patterns. An example where a plurality of the CLBs 700 is connected will be described later. Whether vias are inserted into CP1-CP4 or not is determined depending upon whether a plurality of the CLBs 700 is connected or not.

Whether an inverter 703 is used or not is determined depending upon whether vias are inserted into CP5 and CP6 or not. If the inverter 703 is used, the output LUTOUT of the LUT 701 is not logically inverted. If the inverter 703 is not used, LUTOUT is logically inverted.

Whether an inverter 704 is used or not is determined depending upon whether vias are inserted into CP7 and CP8 or not. If the inverter 704 is used, inputs to EX_LUT_IN and XADEX are not logically inverted. If the inverter 704 is not used, the inputs to EX_LUT_IN and XADEX are logically inverted.

Whether the D-FF 702 is used or not is determined depending upon vias are inserted into CP9 and CP10 or not. If the D-FF 702 is used, the output of the LUT 701 is kept by the D-FF 702. If the D-FF 702 is not used, the output of the LUT 701 is not kept by the D-FF 702. Hence, the circuit equivalent to a combination circuit and a synchronization circuit keeping a result of a circuit equivalent to the D-FF 702 is switched with each other depending upon connection and disconnection of the vias.

Figure 9:
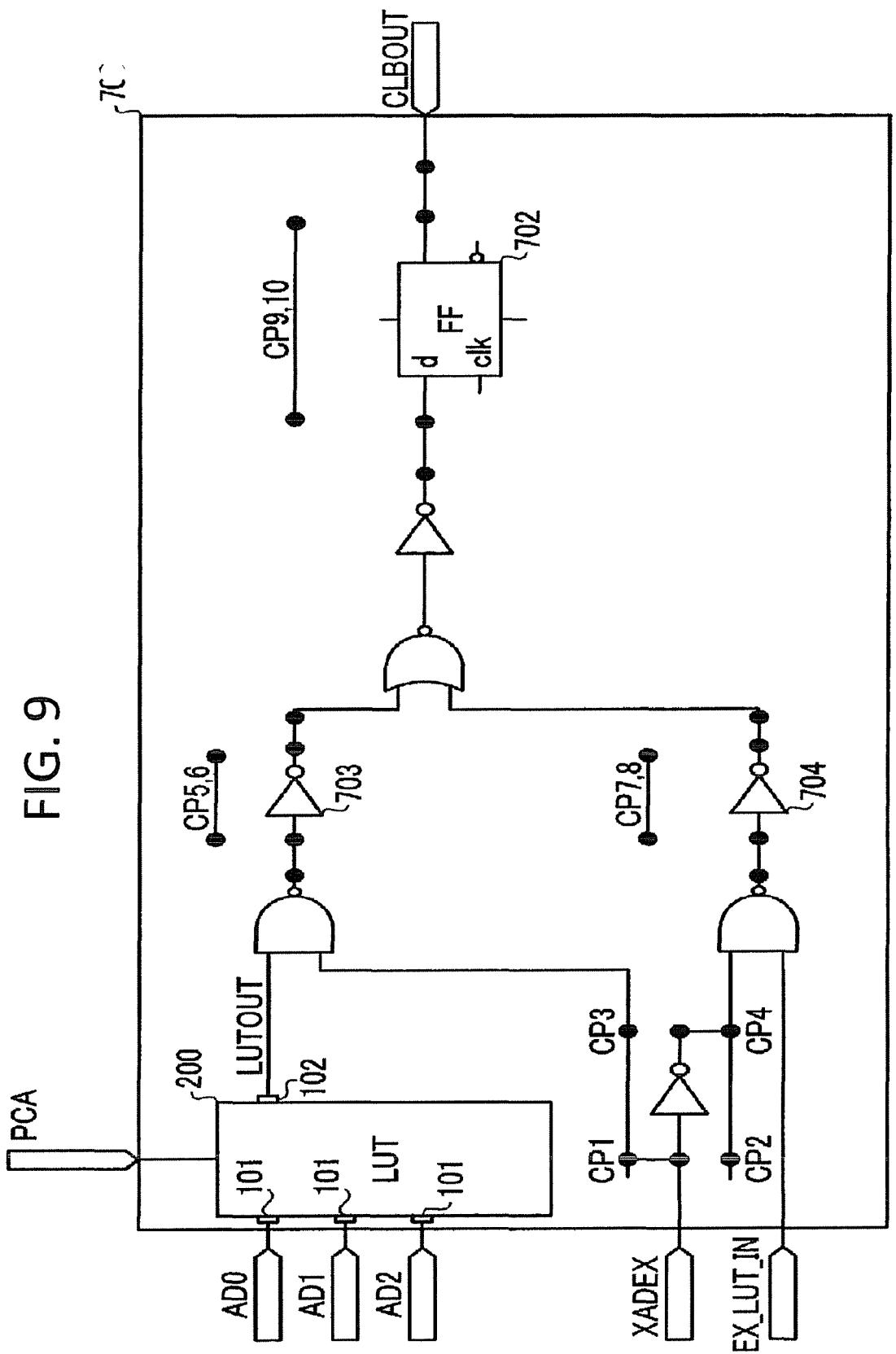
FIG. 9 illustrates a CLB implemented as a logic circuit from a truth table.
Figure 10:
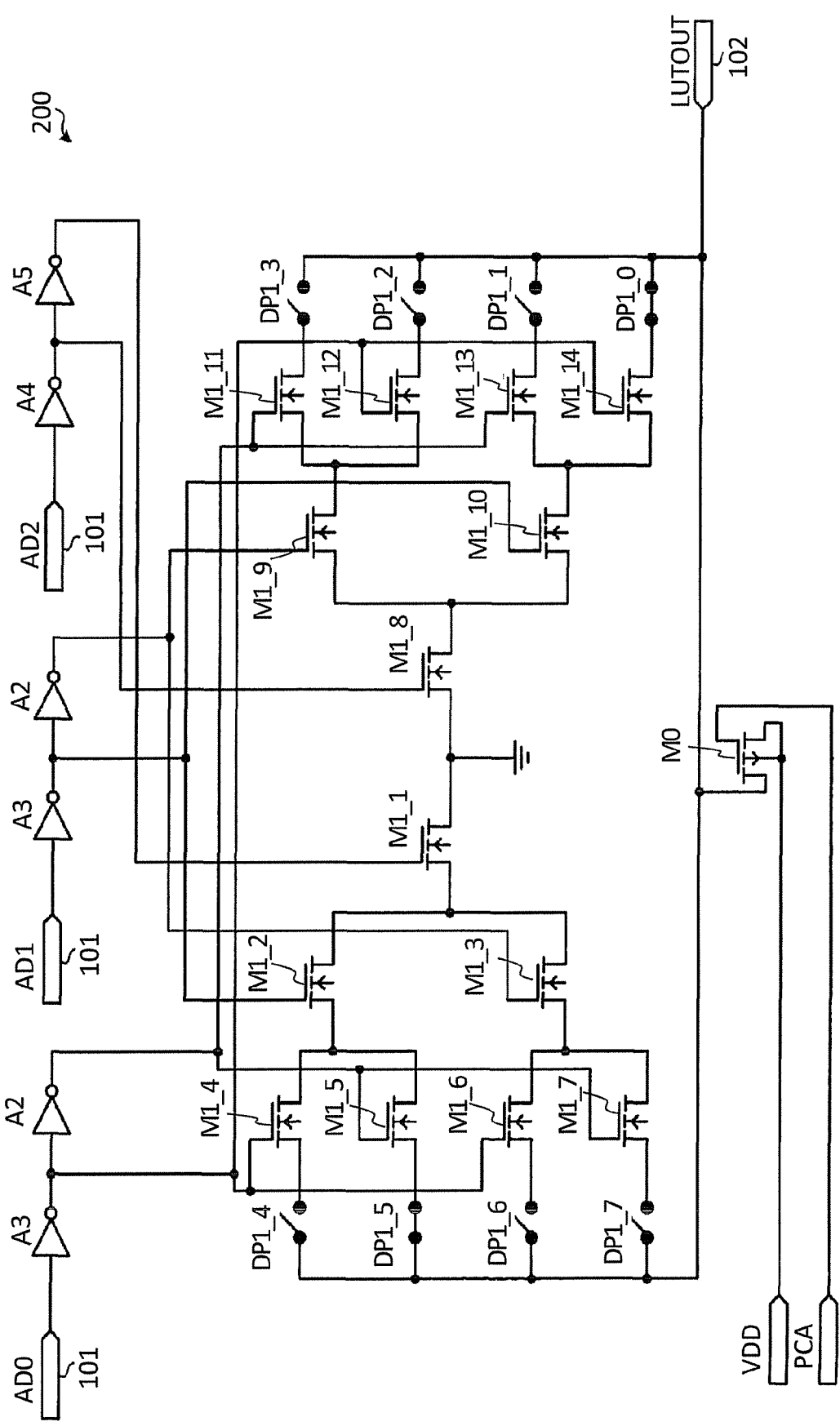
FIG. 10 illustrates the LUT implemented as a logic circuit from a truth table.
Figure 12:
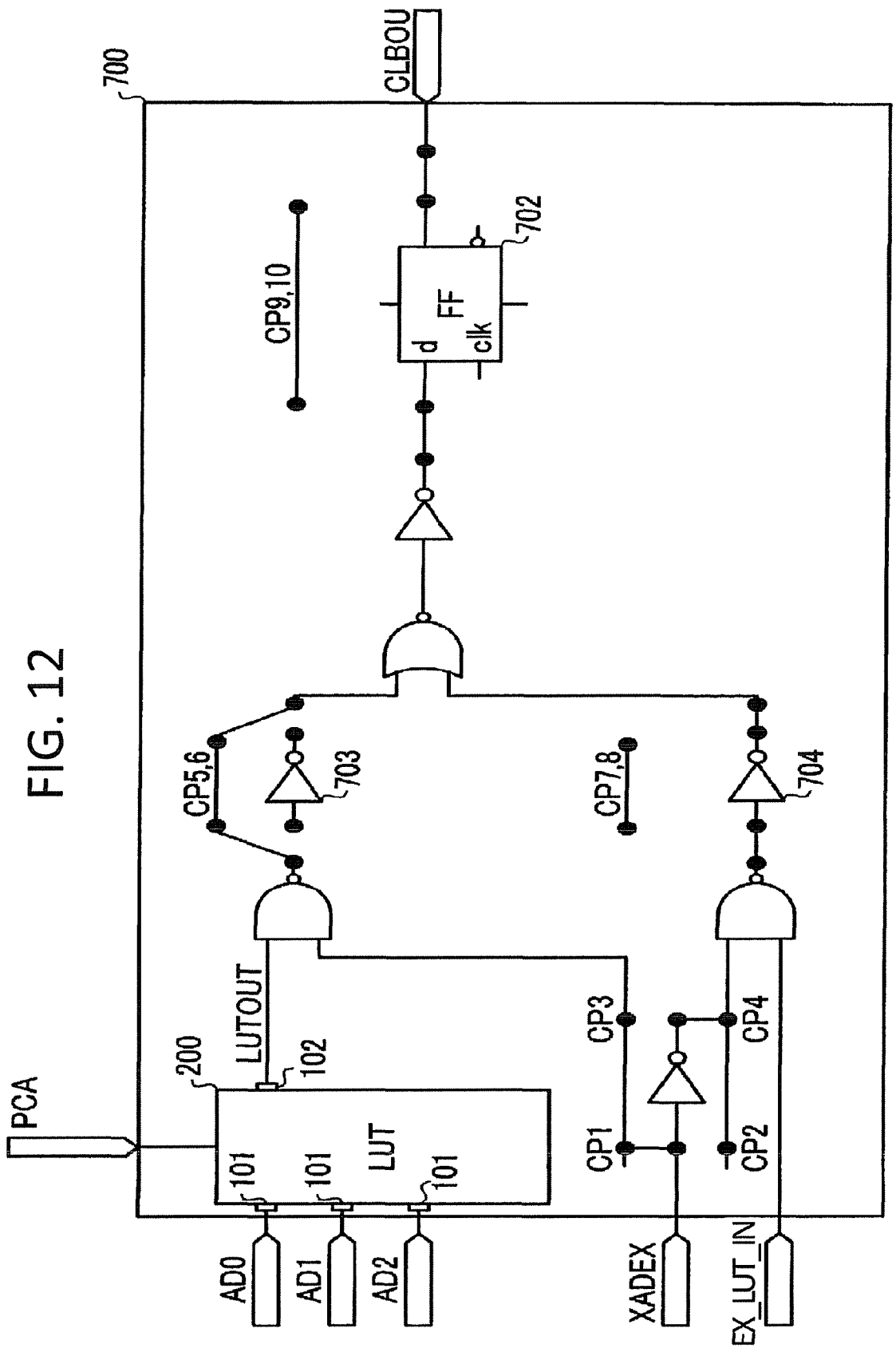
FIG. 12 illustrates the CLB implemented as a logic circuit from a truth table.
Figure 13:
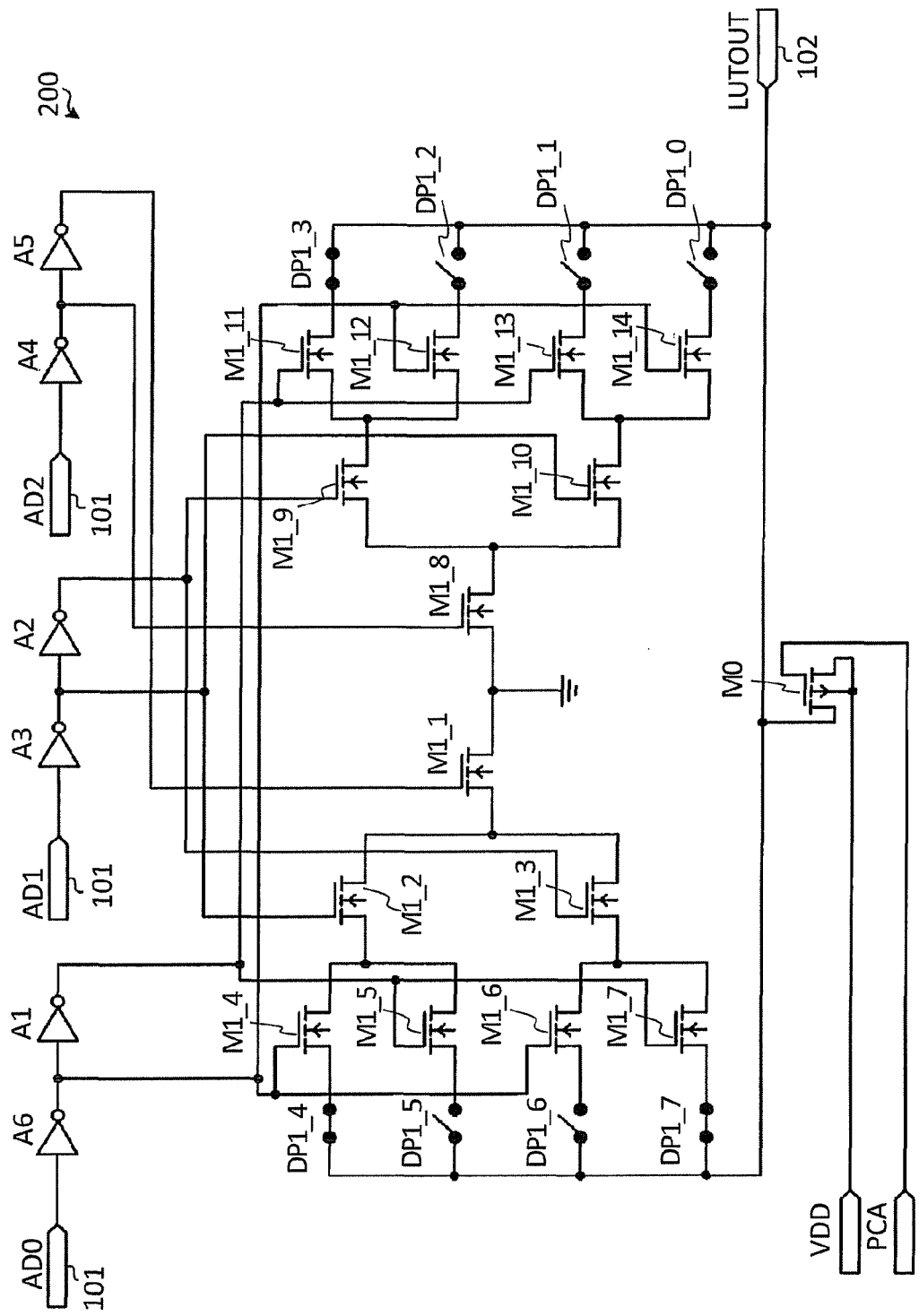
FIG. 13 illustrates the LUT implemented as a logic circuit from a truth table.

Hence, logic may be easily designed or changed, and a semiconductor integrated circuit may be developed for a short period of time, so that the cost may be reduced. Then, specific input/output examples to and from the CLB 700 are shown in FIGS. 8-13. Which via insertion portion a via is inserted into is determined depending upon a case where there are lots of input patterns causing CLBOUT to be 1 and a case where there are lots of input patterns causing CLBOUT to be 0. Hence, a penetrating current may be reduced. FIGS. 8-10 show a case where there are lots of input patterns causing CLBOUT to be 1. FIGS. 11-13 show a case where there are lots of input patterns causing CLBOUT to be 0.

FIG. 8 illustrates an input/output example where there are lots of input patterns causing CLBOUT to be 1. A truth table 800 is a truth table showing an example where outputs of LUTOUT and CLBOUT are determined by an input pattern provided to AD0-AD2. If XADEX=1, a case where AD2=0, AD1=0 and AD0=0 and a case where AD2=1, AD1=0 and AD0=1 cause CLBOUT=0. If XADEX=1, cases other than the above cause CLBOUT=1.

Incidentally, a case where XADEX=0 causing CLBOUT=0 is not counted as included in the number of input patterns. Thus, as two input patterns cause CLBOUT=0 and six input patterns cause CLBOUT=1, there are lots of input patterns causing CLBOUT=1.

Incidentally, cases where PCA=1 and where EX_LUT_IN=1 are omitted for simplicity of the explanation. Then, FIGS. 9 and 10 show examples of via connections of the CLB 700 and the LUT 200 implemented as logic circuits from the truth table 800.

FIG. 9 illustrates the CLB 700 implemented as a logic circuit from the truth table 800. As shown in FIG. 9, the CLB 700 has the LUT 200 having three input terminals 101. Further, the CLB 700 does not logically invert LUTOUT, the output of the LUT 200, and keeps that on the D-FF 702. Vias are inserted into CP1 and CP4, and are not into CP2 and CP3. Then, FIG. 10 shows via connections in the LUT 200.

FIG. 10 illustrates the LUT 200 implemented as a logic circuit from the truth table 800. In the truth table 800, cases where AD2=0, AD1=0 and AD0=0 and where AD2=1, AD1=0 and AD0=1 cause CLBOUT=0. Further, the value of LUTOUT is output to CLBOUT without being logically inverted in the CLB 700 shown in FIG. 9. Hence, cases where AD2=0, AD1=0 and AD0=0 and where AD2=1, AD1=0 and AD0=1 cause LUTOUT=0.

A via is inserted into DP1_0 in the LUT 200 so that the case where AD2=0, AD1=0 and AD0=0 causes LUTOUT=0. Further, a via is inserted into DP1_5 so that the case where AD2=1, AD1=0 and AD0=1 causes LUTOUT=0. No vias are inserted into DP1_1-DP1_4 and DP1_6-DP1_7 so that cases other than the above cause LUTOUT=1. Then, FIGS. 11-13 show a case where there are lots of input patterns causing CLBOUT to be 0.

FIG. 11 illustrates an input/output example including lots of input patterns causing CLBOUT to be 0. A truth table 1100 is a truth table showing an example where outputs of LUTOUT and CLBOUT are determined by an input pattern provided to AD0-AD2. If XADEX=1, a case where AD2=0, AD1=1 and AD0=1, a case where AD2=1, AD1=0 and AD0=0 and a case where AD2=1, AD1=1 and AD0=1 cause CLBOUT=1. If XADEX=1, cases other than the above cause CLBOUT=0.

Incidentally, a case where XADEX=0 causing CLBOUT=0, but not zero depending upon the output of the LUT, is not counted as included in the number of the states where CLBOUT=0. Thus, as five input patterns cause CLBOUT=0 and three input patterns cause CLBOUT=1, there are lots of states where CLBOUT=0.

Incidentally, cases where PCA=1 and where EX_LUT_IN=1 are omitted for simplicity of the explanation. Then, FIGS. 12 and 13 show examples of via connections of the CLB 700 and the LUT 200 of the truth table 1100.

FIG. 12 illustrates an example of the CLB 700 implemented as a logic circuit from the truth table 1100. As shown in FIG. 12, the CLB 700 logically inverts LUTOUT, the output of the LUT 200, and keeps that on the D-FF 702. Further, as vias are inserted into CP1 and CP4 and are not into CP2 and CP3, the CLB 700 is not connected to CLBs 700 other than that. Then, FIG. 13 show the LUT 200 implemented as a logic circuit from the truth table 1100.

FIG. 13 illustrates the LUT 200 implemented as a logic circuit from the truth table 1100. In the truth table 1100, cases where AD2=0, AD1=1 and AD0=1, where AD2=1, AD1=0 and AD0=0 and where AD2=1, AD1=1 and AD0=1 cause CLBOUT=1. Further, the value of LUTOUT is logically inverted and output to CLBOUT in the CLB 700. Hence, cases where AD2=0, AD1=1 and AD0=1, where AD2=1, AD1=0 and AD0=0 and where AD2=1, AD1=1 and AD0=1 cause LUTOUT=0.

A via is inserted into DP1_3 in the LUT 200 so that the case where AD2=0, AD1=1 and AD0=1 causes LUTOUT=0. Further, a via is inserted into DP1_4 so that the case where AD2=1, AD1=0 and AD0=0 causes LUTOUT=0. Further, a via is inserted into DP1_7 so that the case where AD2=1, AD1=1 and AD0=1 causes LUTOUT=0. As the other input patterns cause LUTOUT=1, no vias are inserted into DP1_1, DP1_2, DP1_5 and DP1_6.

In a case where a value "0" is output to LUTOUT in the LUT 200, as described above, a penetrating current flows. Thus, which via insertion portion a via is inserted into or not is determined depending upon a case where there are lots of input patterns causing the output data of CLBOUT to be "0" and a case where there are lots of input patterns causing the output data of CLBOUT to be "1".

In a case where there are lots of input patterns causing the output data of CLBOUT to be "1", vias are inserted into via insertion portions in the LUT 200 corresponding to the input pattern causing the output data to be "0". Further, no vias are inserted into via insertion portions where the output data of the LUT 200 in the CLB 700 is logically inverted.

Meanwhile, in a case where there are lots of input patterns causing the output data of CLBOUT to be "0", vias are inserted into via insertion portions in the LUT 200 corresponding to the input pattern causing the output data to be "1". Further, vias are inserted into via insertion portions where the output data of the LUT 200 in the CLB 700 is logically inverted. Hence, the penetrating current may be reduced. Thus, the semiconductor integrated circuit may achieve less power. Then, FIGS. 14 and 15 show a case where a plurality of the CLBs 700 is connected.

Figure 14:
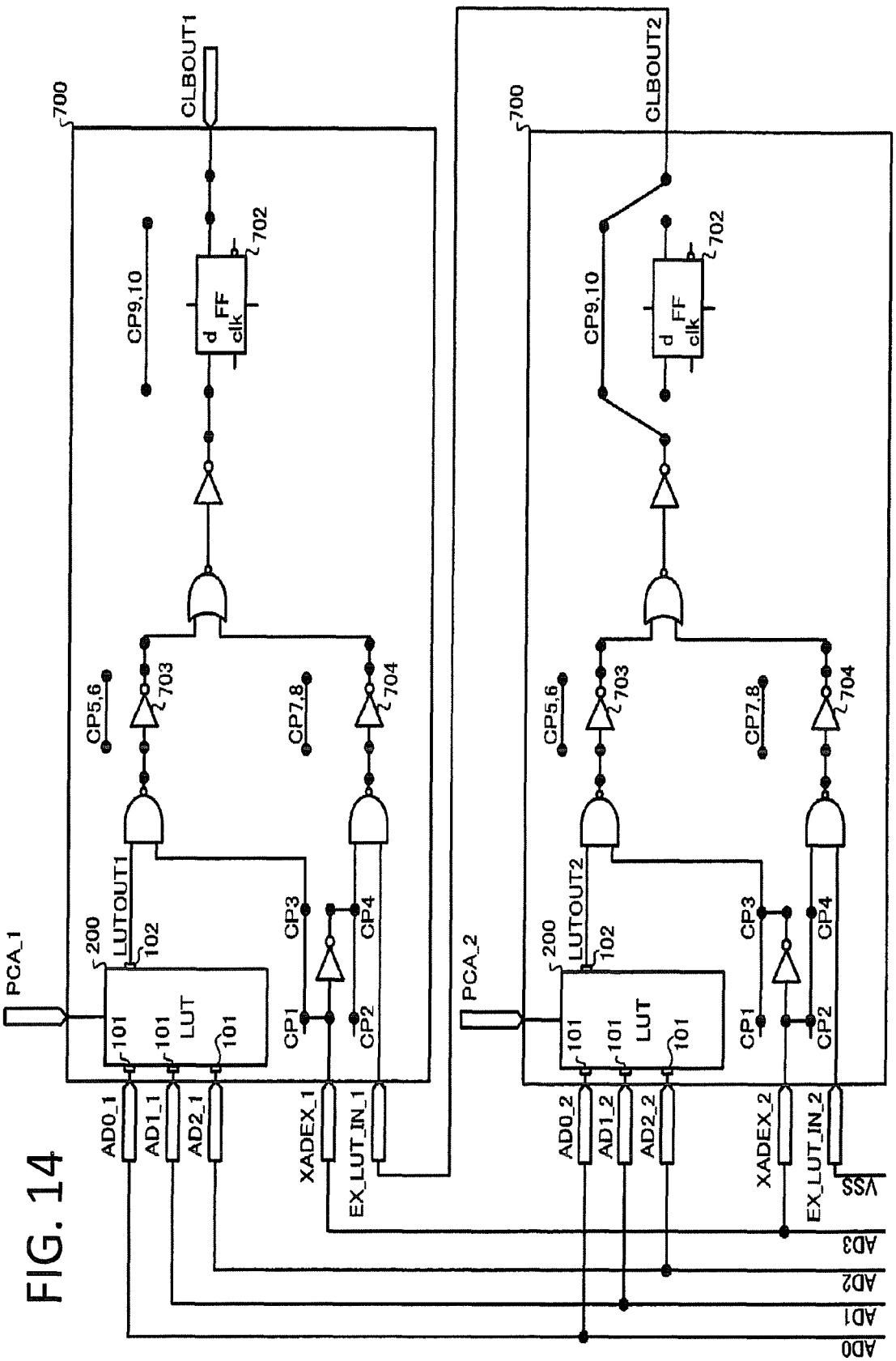
FIG. 14 illustrates an example where a plurality of the CLBs is connected.

FIG. 14 illustrates an example where a plurality of the CLBs 700 is connected. Let the one CLB 700 whose EX_LUT_IN is provided with the output of CLBOUT of the other CLB 700 be a master CLB, and the other CLB 700 be a slave CLB 700. Let the output of the master CLB be CLBOUT1, and the output of the LUT 200 in the master CLB be LUTOUT1. Further, let the output of the slave CLB be CLBOUT2, and the output of the LUT 200 in the slave CLB be LUTOUT2.

The value of LUTOUT1 or LUTOUT2 is kept by the D-FF 702 of the master CLB. Meanwhile, the value of LUTOUT2 is not kept by the D-FF 702 of the slave CLB and is directly provided to EX_LUT_IN of the master CLB. Then, FIG. 15 shows a truth table where a plurality of the CLBs 700 is connected.

FIG. 15 illustrates a truth table where a plurality of the CLBs 700 is connected. A truth table 1500 determines outputs of CLBOUT1 and CLBOUT2 depending upon an input pattern provided to AD0-AD3. If AD3=0, the value of CLBOUT2 is output to CLBOUT1. If AD3=1, then, the value of LUTOUT1 is output to CLBOUT1.

A plurality of the CLBs 700 is connected, as described above, so that the input patterns increase without a change of the number of the input terminals 101 of the LUT 200. Then, FIG. 16 shows an input to the precharge circuit.

Figure 16:
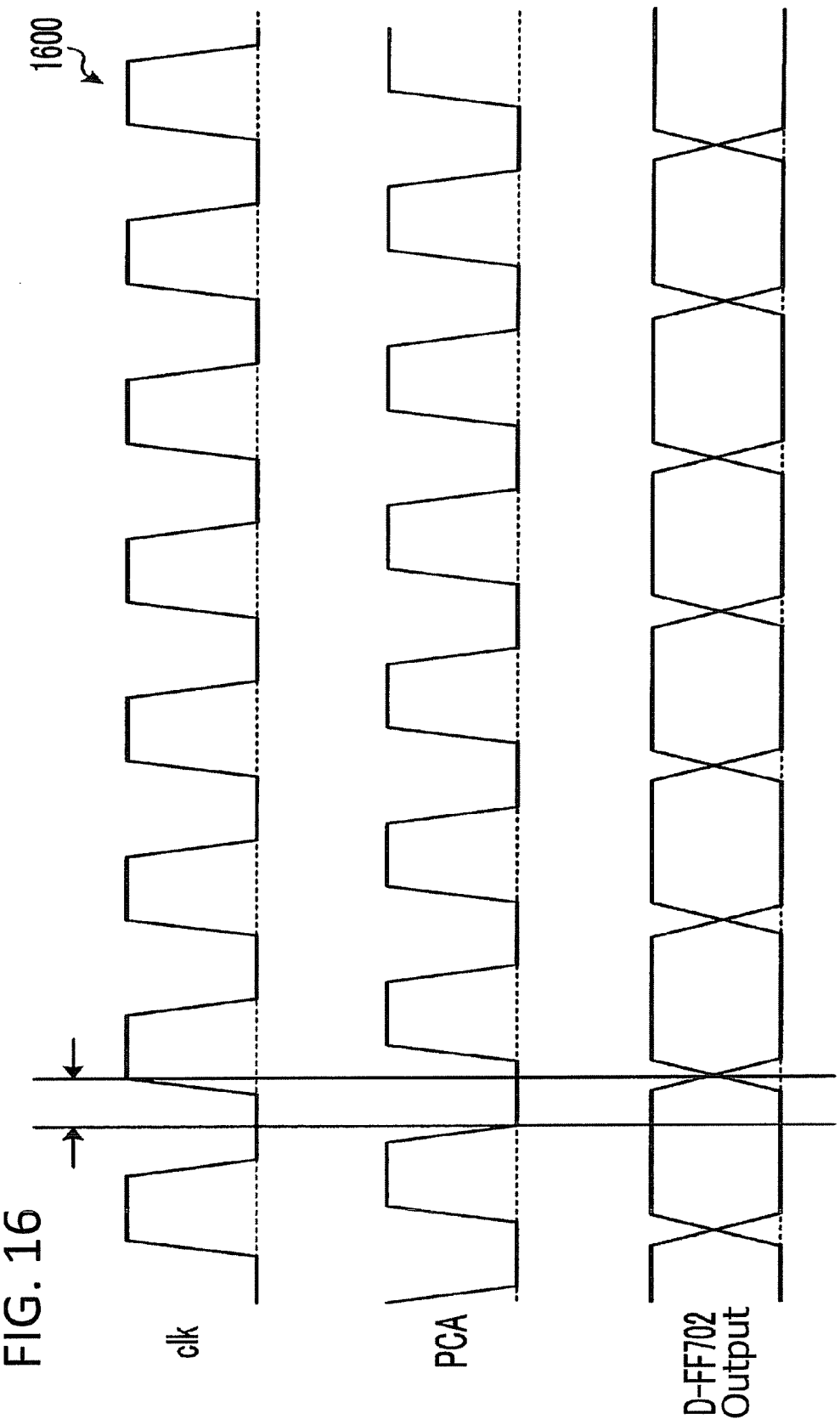
FIG. 16 illustrates a timing chart of an input to a precharge circuit.

FIG. 16 illustrates a timing chart of an input to the precharge circuit. A timing chart 1600 shows timing of clk for taking data in the D-FF 702, timing of PCA on an input terminal of the precharge circuit, and output timing of the D-FF 702. For instance, let PCA change at the timing a quarter-cycle apart from the clk cycle.

The precharge circuit is turned on at the clk rising edge when the D-FF 702 takes in data, and is turned off at the clk falling edge when the D-FF 702 does not take in data. As PCA is synchronized with the clk timing, the penetrating current may be reduced more than in a case where the precharge circuit is always kept on. Thus, the CLB 700 may save power.

According to the second embodiment, vias are inserted into selected ones of the via insertion portions of a single via layer so that logic is determined. Thus, in a case where a product of different logic is developed, only the single via layer is changed in the making process. Thus, a period of time for development may be shortened and the cost may be reduced.

Third Embodiment

According to a third embodiment, a semiconductor integrated circuit including a plurality of the CLBs of the second embodiment and the wiring assembly interconnecting the CLBs is provided with a single via layer, and the via layer has the via insertion portion of the second embodiment and a via insertion portion of the wiring assembly. Further, a via is inserted into at least selected one of the via insertion portions in the semiconductor integrated circuit.

Figure 17:
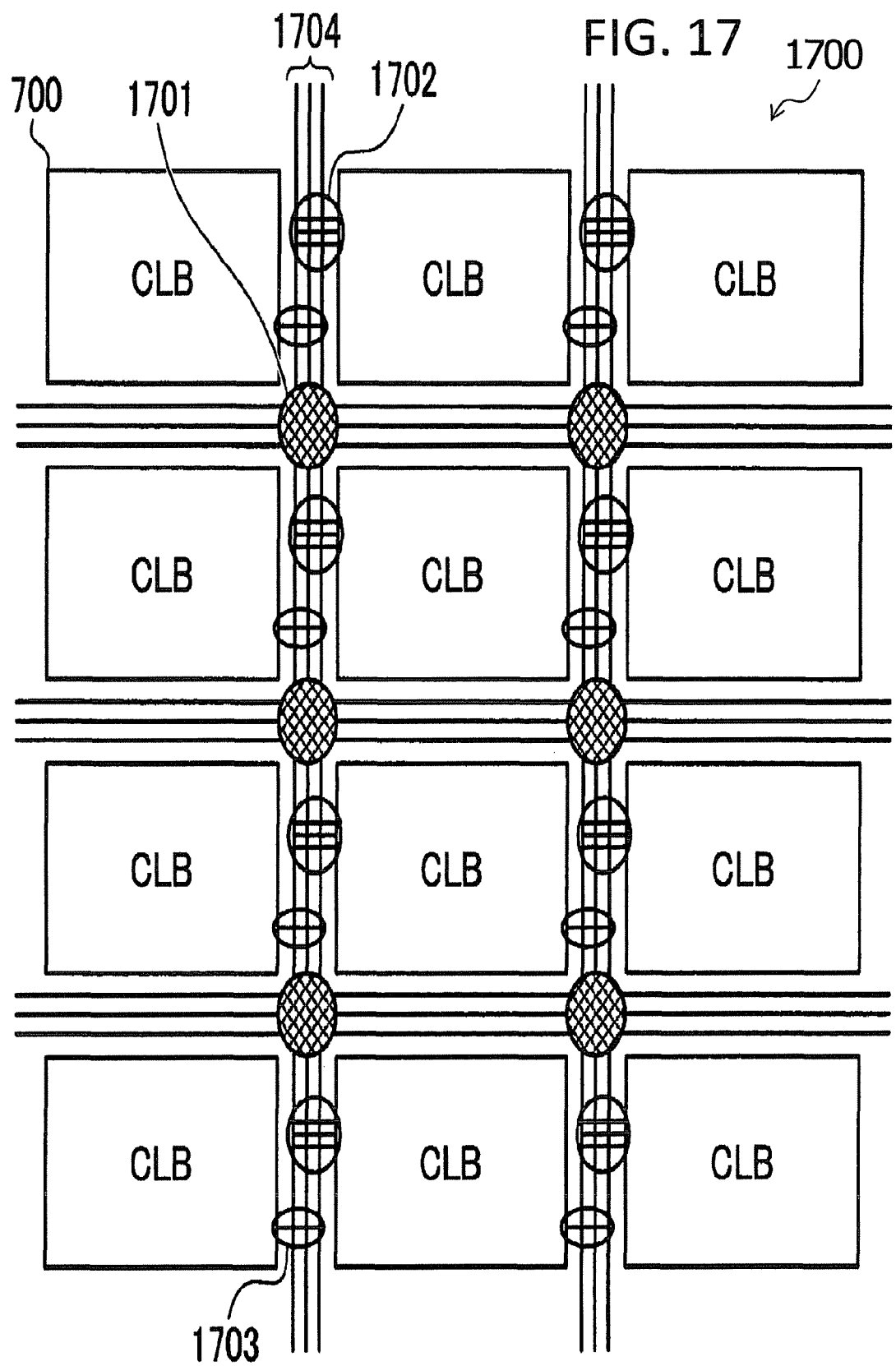
FIG. 17 illustrates a semiconductor integrated circuit of a third embodiment.

FIG. 17 illustrates a semiconductor integrated circuit of the third embodiment. A semiconductor integrated circuit 1700 is constituted by CLBs 700, switch matrices 1701, CLB input wiring assemblies 1702, CLB output wiring assemblies 1703 and wiring groups 1704. The plural CLBs 700 are arranged as forming an array.

Further, the switch matrices 1701 selectively interconnect the CLBs 700. The CLB input wiring assembly 1702 selectively connects the wiring group 1704 and the input terminals 101 of the CLB 700. The CLB output wiring assembly 1703 selectively connects the wiring group 1704 and the output terminal 102 of the CLB 700. As described above, the CLB 700s each include respective LUTs 701 and circuit element groups.

Logic of a circuit equivalent to a combination circuit in the CLB 700 is changed depending upon whether vias are inserted or not into a plurality of via insertion portions provided to a single via layer. Further, the switch matrix 1701 is constituted by a plurality of via insertion portions in the single via layer and a wiring assembly. Further, a via layer which is a same as the single via layer having the via insertion portions of the switch matrix 1701 has the via insertion portions of the switch matrix 1701.

Figure 18:
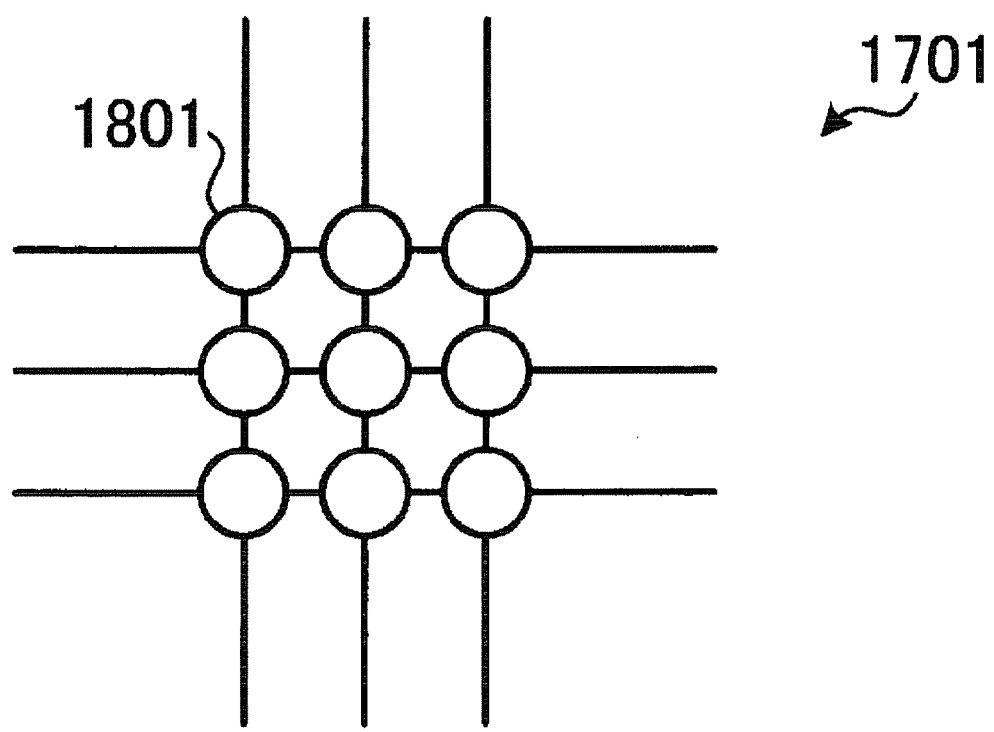
FIG. 18 illustrates a switch matrix.
Figure 19:
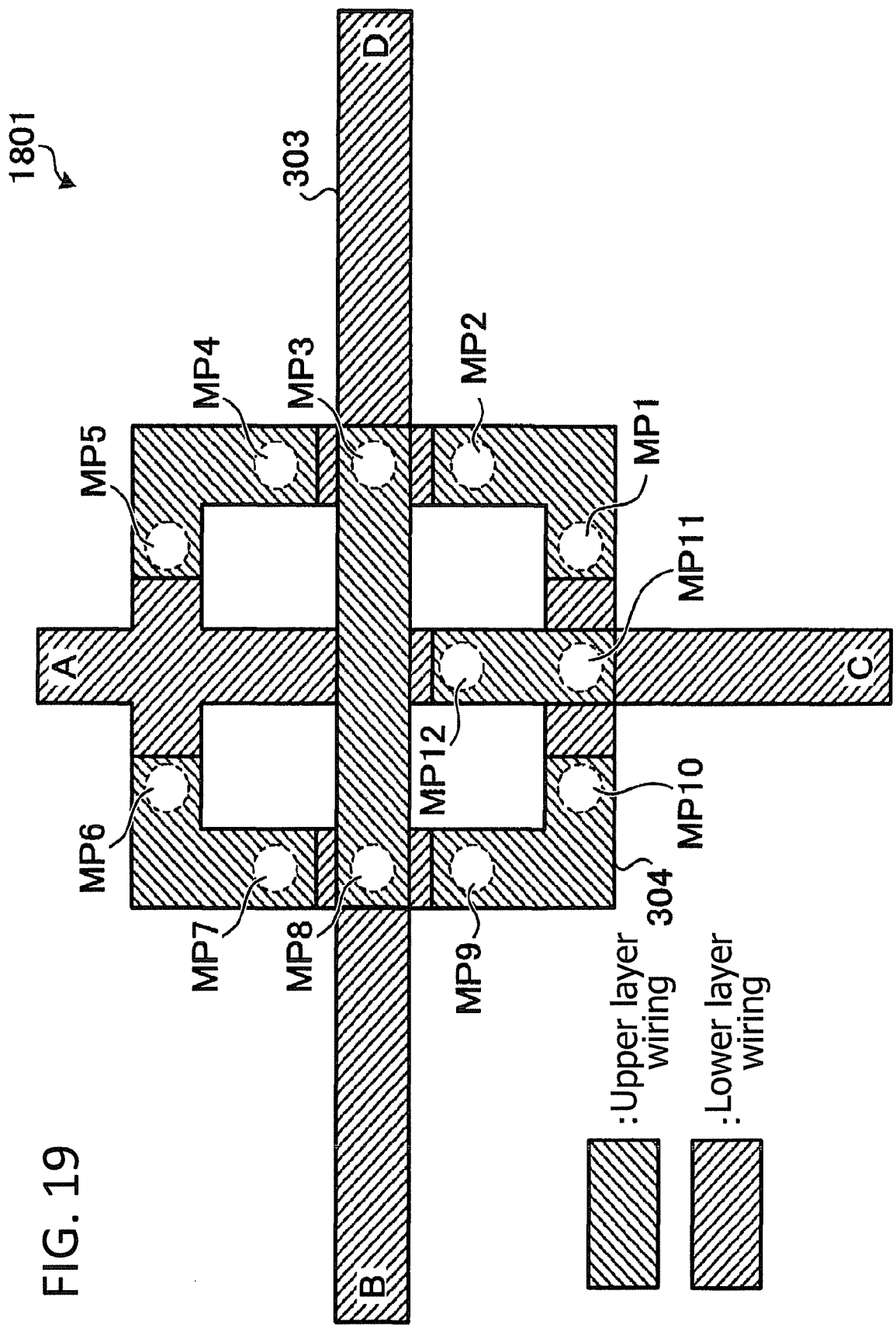
FIG. 19 illustrates an example of layout data of a router switch.
Figure 20:
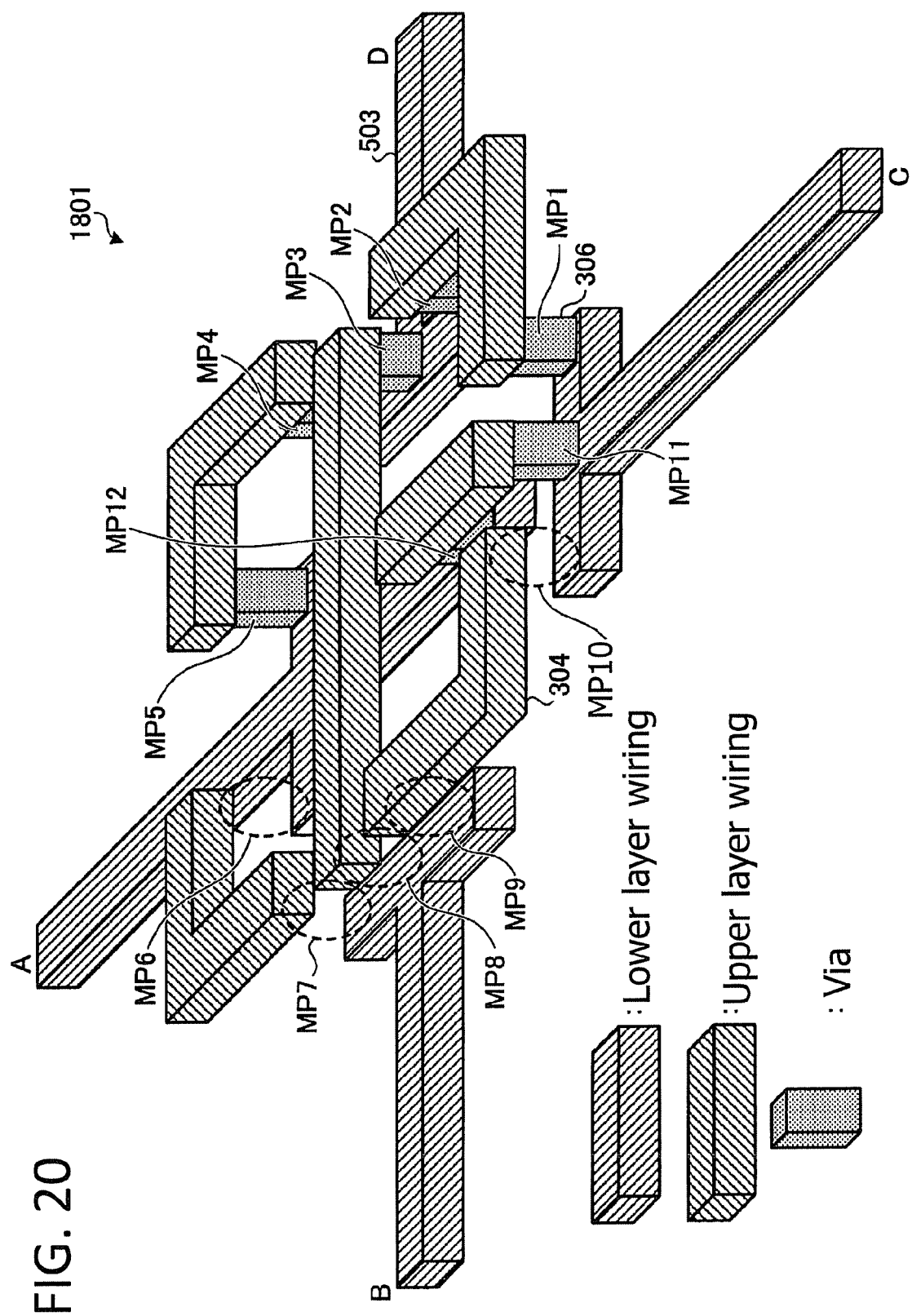
FIG. 20 illustrates a wiring example due to the router switch in 3D.
Figure 21:
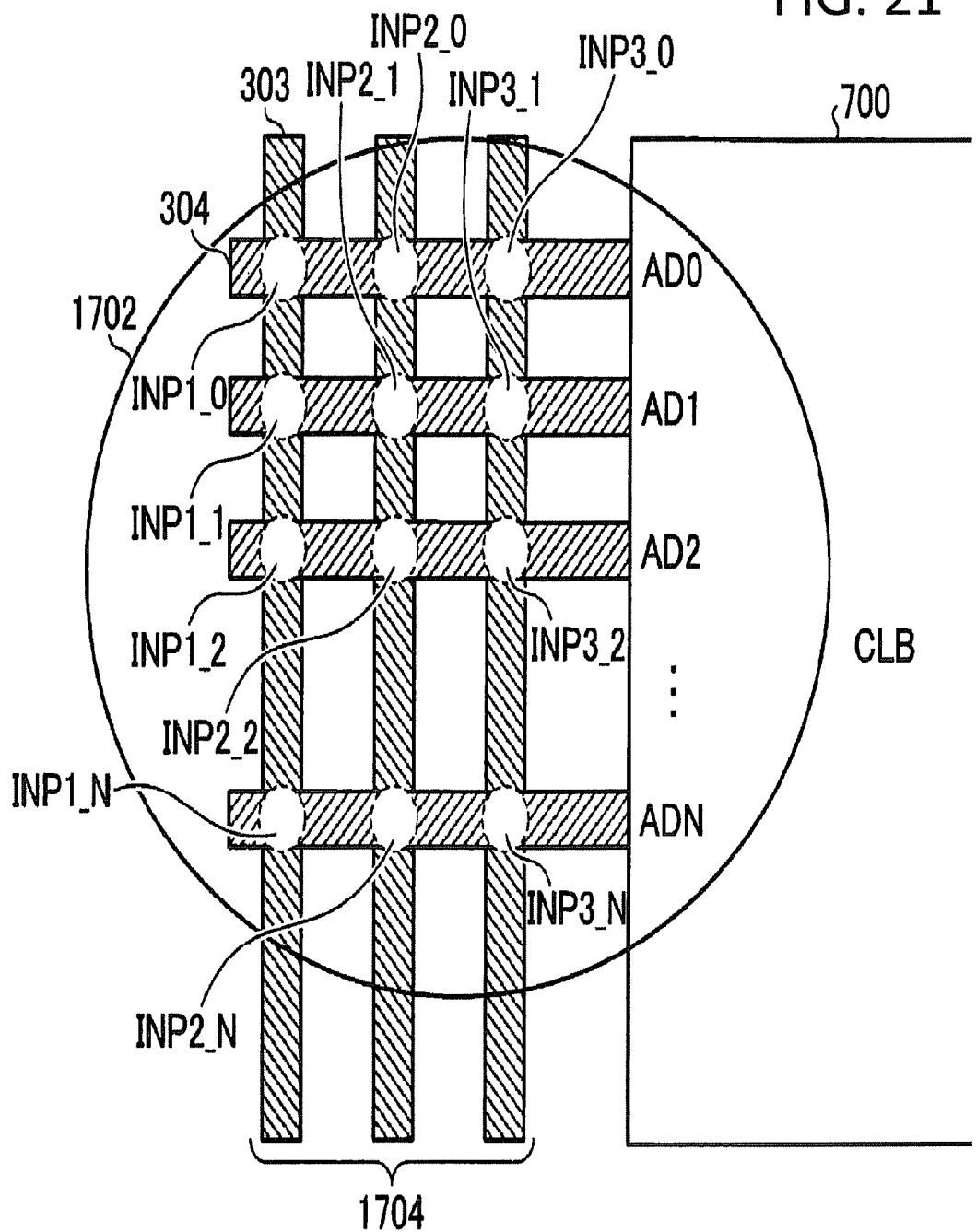
FIG. 21 illustrates a CLB input wiring assembly.
Figure 22:
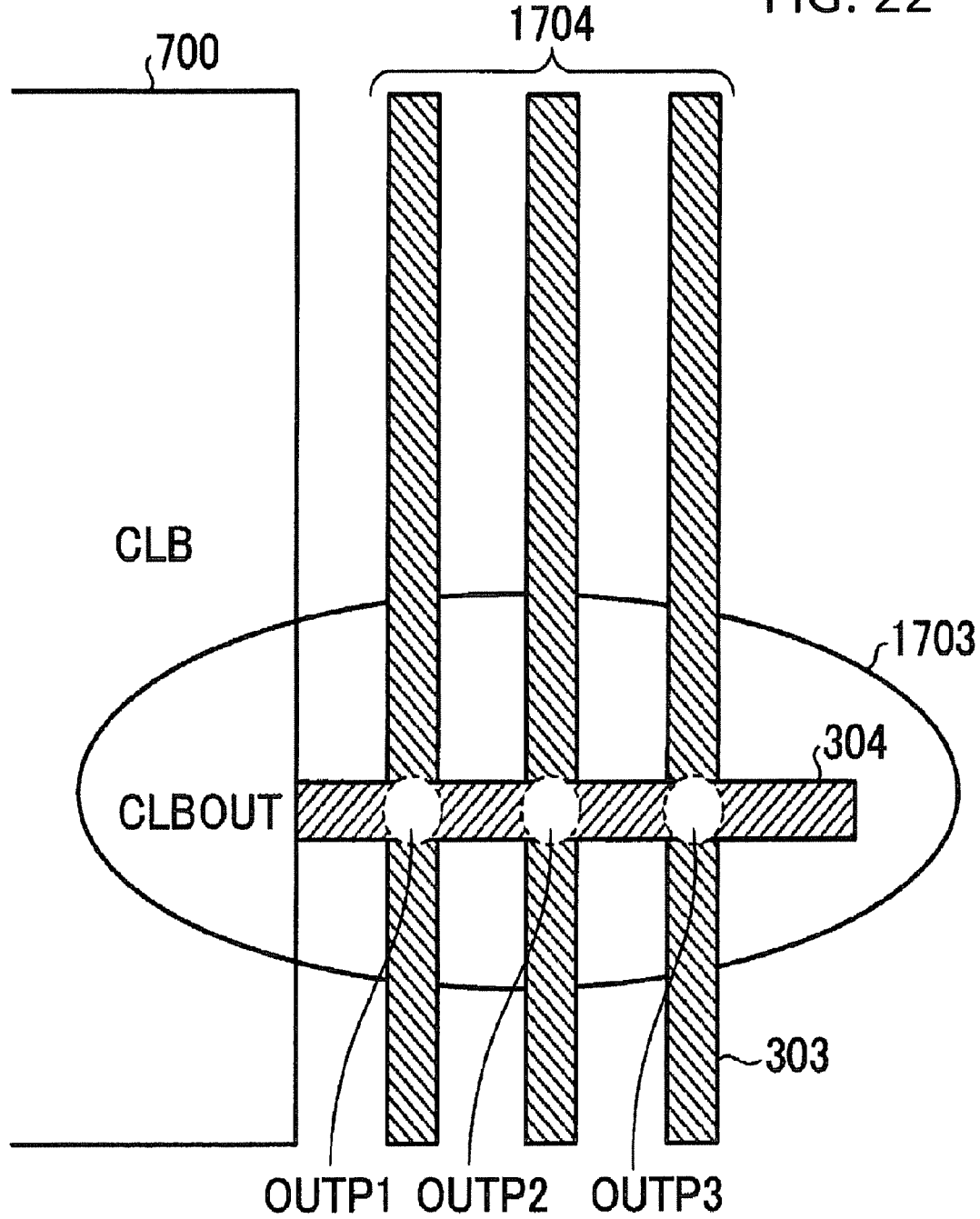
FIG. 22 illustrates a CLB output wiring assembly.

A semiconductor integrated circuit of different logic may thereby be developed owing to a change of the single via layer only, and the cost may be reduced. Then, FIGS. 18-20 show the switch matrix 1701. Further, FIGS. 21 and 22 show the CLB input wiring assembly 1702 and the CLB output wiring assembly 1703, respectively.

FIG. 18 illustrates the switch matrix 1701. A plurality of router switches 1801 are arranged as forming an array in the switch matrix 1701. The router switch 1801 is wired depending upon whether a via is inserted into a via insertion portion provided to the single via layer. The CLBs 700 are wired and interconnected by means of the router switches 1801. Then, FIG. 19 shows a configuration of the router switch 1801.

FIG. 19 illustrates an example of layout data of the router switch 1801. The router switch 1801 is formed by an upper layer wiring assembly 304, a lower layer wiring assembly 303 and via insertion portions MP1-MP12. The via insertion portions MP1-MP12 are via insertion portions of the same via layer as the single via layer of the first and second embodiments. Connection relations among the A-wiring, the B-wiring, the C-wiring and the D-wiring are determined depending upon which via insertion portion a via is inserted to. Then, FIG. 20 shows an example of the wiring by means of the router switch 1800.

FIG. 20 illustrates a wiring example due to the router switch 1800 in 3D. As shown in FIG. 20, vias 306 are inserted into via insertion portions MP1-MP5, MP11 and MP 12 in the router switch 1800. Thus, the A-wiring, the B-wiring and the C-wiring are interconnected through the vias 306.

As described above, the via 306 is a via on the same layer as the via for changing logic in the LUT 700. Thus, all the vias 306 of the router switch 1801 and V2 of the stack via 307 in the LUT are a same via layer. Thus, semiconductor integrated circuits of different logic may be developed only depending upon whether vias are inserted or not into the single via layer. Then, FIG. 21 shows the CLB input wiring assembly 1702.

FIG. 21 illustrates the CLB input wiring assembly 1702. The CLB wiring assembly 1702 is formed by the upper layer wiring assembly 304, INP1_0-INP1_N, INP2_0-INP2_N, and INP3_0-INP3_N. The symbols INP1_0-INP1_N, INP2_0-INP2_N, and INP3_0-INP3_N indicate via insertion portions. Further, the via layer of INP1_0-INP1_N, INP2_0-INP2_N, and INP3_0-INP3_N is the same via layer as the via insertion portions in the LUT described above.

Input terminals AD0-ADN are formed by the upper layer wiring assembly 304. Thus, the upper layer wiring assembly 304 and the lower layer wiring assembly 303 are selectively connected depending upon which via insertion portion of the CLB input wiring assembly 1702 a via is inserted into. Then, input data provided to the CLB 700 is determined. Then, FIG. 22 illustrates the CLB output wiring assembly 1703.

FIG. 22 illustrates the CLB output wiring assembly 1703. The CLB output wiring assembly 1703 is formed by the upper layer wiring assembly 304 and OUTP1-OUTP3. The symbols OUTP1-OUTP3 indicate via insertion portions. The via layer of OUTP1-OUTP3 is the same layer as V2 of the stack via 307 that is the via insertion portion in the LUT described above.

Similarly as the layout data 300 described above, CLBOUT is formed by the upper layer wiring assembly 304. Thus, the upper layer wiring assembly 304 and the lower layer wiring assembly 303 are selectively connected depending upon which via insertion portion of the CLB output wiring assembly 1703 a via is inserted into. Then, the output data of the CLB 700 is provided as input data to another CLB 700.

According to the third embodiment, vias are inserted into selected ones of the via insertion portions of the single via layer so that the logic and the wiring are determined. Thus, in a case where a new semiconductor integrated circuit having different logic is developed, a single via layer only is changed in the making process. Thus, a period of time for development may be shortened and the cost may be reduced. Then, FIG. 23 shows an embedded array which uses the embodiment.

Figure 23:
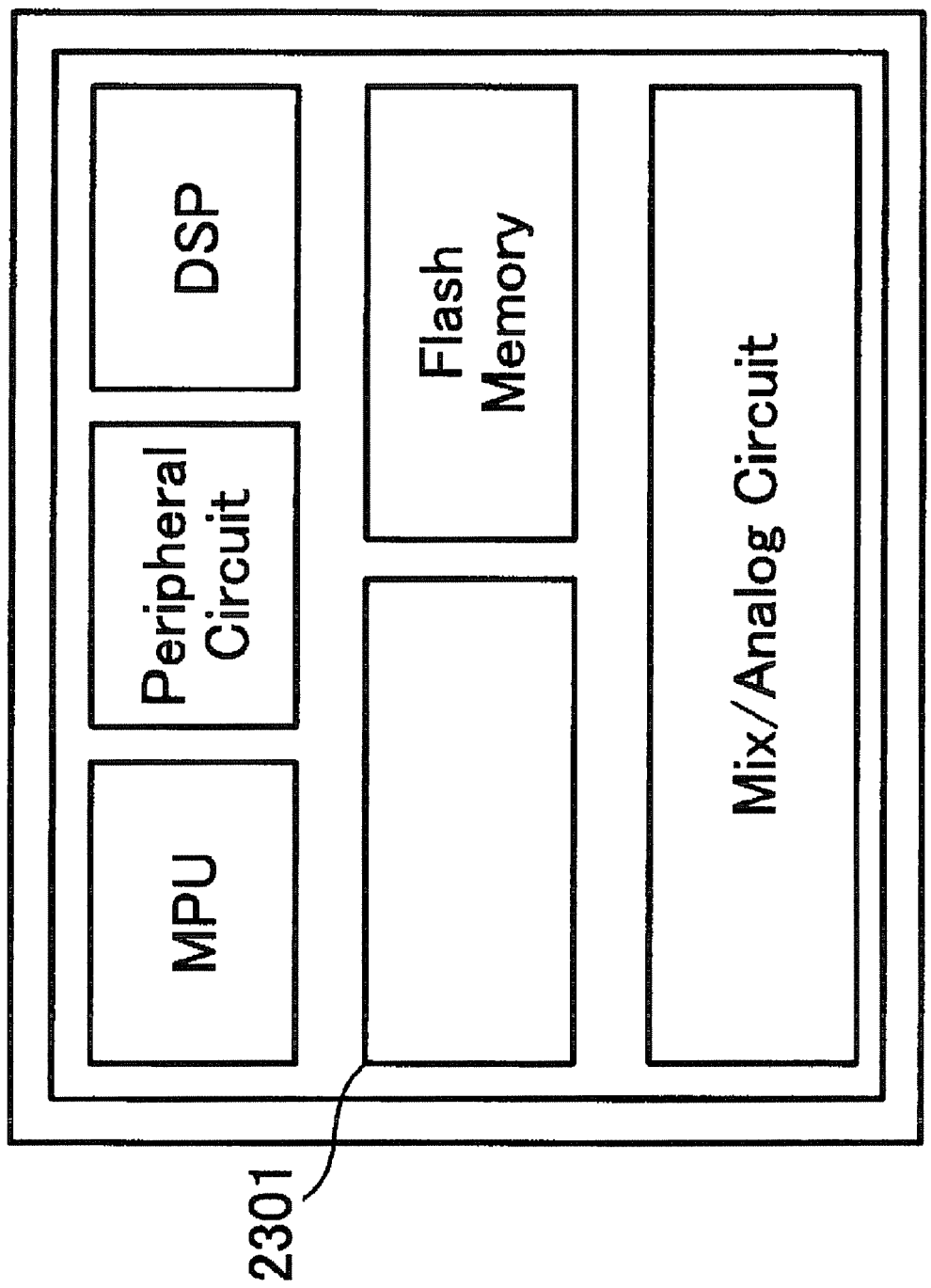
FIG. 23 illustrates an example of an embedded array which uses the embodiment.

FIG. 23 illustrates an example of an embedded array which uses the embodiment. The embedded array 2300 is constituted by including intellectual property of standard cells such as an MPU (Micro Processing Unit), a DSP (Digital Signal Processing), a FLASH Memory, a Peripheral Circuit, a Mix/Analog Circuit, and an area 2301 where logic may be changed owing to a single via layer. Further, e.g., IP cores are interconnected by a router switch 1801. Inter-IP wiring or the area 2301 in the embedded array 2300 may be modified owing to a change of a single via layer only.

The IP formed by the standard cells and a circuit that is requested to change the logic constituted by the CLBs 700 of the first to third embodiments and the switch matrix 1701 are integrated on a same semiconductor integrated circuit. The area of the semiconductor integrated circuit may thereby be reduced. Hence, the cost may be reduced.

Then, a method for making the LUT and the semiconductor integrated circuit of the first to third embodiments will be explained. First, resist of selected one of via insertion portions of a single via layer on the basis of logic is exposed. To put it specifically, e.g., an electron beam lithography device is used so that a wafer is irradiated with an electron beam on the basis of coordinate system data of the selected portion. Then, an insulation layer of the exposed portion is etched. Thus, a via hole is formed at the selected portion. Then, the via hole is filled with conductive metal so that a via is formed.

Thus, in a case where a new semiconductor integrated circuit having different logic is made, no change occurs in processes other than the exposure process for forming the via hole. Thus, as using a special making process is not requested, the semiconductor integrated circuit may be easily made. Thus, a period of time for development may be shortened and the cost may be reduced.

The logic in the LUT and the CLB 700 described above is determined not by a saving element like an SRAM but depending upon whether vias are inserted into the via insertion portions of the single via layer. Further, the wiring of the switch matrix 1701 is determined depending upon whether vias are inserted into the via insertion portions of the single via layer. Further, let all the via insertion portions in the LUT and the CLB 700 and all the via insertion portions of the switch matrix 1700 be on the same via layer.

According to the LUT and the method for making the LUT, as described above, as a via is inserted into at least one of the via insertion portions of the single via layer for determining logic so that operation may be accelerated and a degree of integration may be enhanced.

Further, the LUT has a selection circuit constituted by $N \times 2^N$ transistors turned on or off on the basis of $2^N$ input patterns so as to be implemented by a simple configuration.

Further, the LUT has a selection circuit constituted by transistors fewer than $N \times 2^N$ and more than the number given by the equation (2) so as to reduce the number of the transistors. Hence, the area of the LUT may be reduced and the cost may be reduced.

Further, at least a portion of the via insertion portions are arranged as forming a line so that whether a via is inserted or not may be easily changed. Thus, the LUT may be easily made.

According to the semiconductor integrated circuit and the method for making the semiconductor integrated circuit described above, the semiconductor integrated circuit including the LUT and the group of circuit elements provided outside the LUT is provided with the single via layer. The single via layer has $2^N$ via insertion portions of the LUT and a via insertion portion of the group of circuit elements, and vias are inserted into the selected via insertion portions. Hence, vias are inserted into selected ones of the via insertion portions of the single via layer so that logic is determined. Thus, a period of time and the cost for development may be reduced.

Further, in order to make a semiconductor integrated circuit for which the number of input patterns letting the output data be 0 is greater than the number of input patterns letting the output data be 1, vias are inserted into portions where the logic of the output data of the LUT is inverted in the via insertion portions in the LUT. Further, vias are inserted into portions where the logic of the output data of the LUT is inverted in the via insertion portions of the external group of circuit elements. Hence, the penetrating current may be reduced. Thus, the semiconductor integrated circuit may save power.

Further, a plurality of semiconductor integrated circuits, a via insertion portion in a same via layer as a single via layer which selectively interconnects the semiconductor integrated circuits, and a via which is inserted into at least one of the via insertion portions are provided so that wiring is done only on the single via layer. Thus, a period of time and the cost for development may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A lookup table, comprising:
   M input terminals, each provided with an input pattern, where M is at least one;
   an output terminal connected to an output node;
   a selection circuit including a number N of NMOS transistors that are arranged in series between the output node and a ground terminal, wherein a gate of each NMOS transistor is connected to one of the M input terminals, the output node is connected to a drain of one of the N NMOS transistors, and N is at least one; and
   a conductive metal which connects to the output node and the drain of one of the N NMOS transistors, and
   wherein the selection circuit determines the number of NMOS transistors required to generate an output based on positioning of vias inserted among the M input terminals.

2. The lookup table according to claim 1, wherein the selection circuit is formed by $M \times 2^M$ transistors whose on/off states are determined on the basis of the input patterns.

3. The lookup table according to claim 1, wherein the selection circuit is formed by a plurality of transistors whose on/off states are determined on the basis of the input patterns, the number of the transistors being given by a following equation:

$$\sum_{i=1}^{M} 2^i \le n \le M \times 2^M$$

where n is the number of the transistors.

4. The lookup table according to claim 1, wherein the number of NMOS transistors required to generate the output is determined by analyzing locations of via insertions within a layer in relation to an input of each of the M input terminals.

5. A semiconductor integrated circuit, comprising:
a lookup table including
M input terminals, each provided with an input pattern, where M is at least one;
an output terminal connected to a first output node;
a selection circuit including a number N of NMOS transistors that are arranged in series between the first output node and a ground terminal, wherein a gate of each NMOS transistor is connected to one of the input terminals, the first output node is connected to a drain of one of the N NMOS transistors, and N is at least one; and
a conductive metal which connects to the output node and the drain of one of the N NMOS transistors;
a group of circuit elements provided outside the lookup table; and
a second output node interconnecting the circuit elements in the group of circuit elements, and connecting the circuit elements and the output terminal of the lookup table, and
wherein the selection circuit determines the number of NMOS transistors required to generate an output based on positioning of vias inserted among the M input terminals.

6. The semiconductor integrated circuit according to claim 5, wherein the number of NMOS transistors required to generate the output is determined by evaluating locations of via insertions within a layer in relation to an input of each of the M input terminals.

7. A semiconductor integrated circuit, comprising:
a plurality of first semiconductor integrated circuits;
a third output node connecting a wiring member from the plural first semiconductor integrated circuits, and interconnecting the first semiconductor integrated circuits, wherein each of the first semiconductor integrated circuits, includes:
a lookup table including M of input terminals, each provided with an input pattern, where M is at least one;
an output terminal connected to a first output node;
a selection circuit including a number N of NMOS transistors that are arranged in series between the first output node and a ground terminal, wherein a gate of each NMOS transistor is connected to one of the input terminals, and the first output node is connected to a drain of one of the N NMOS transistors, and N is at least one; and
a conductive metal which connects to the output node and the drain of one of the N NMOS transistors;
a group of circuit elements provided outside the lookup table; and
a second output node interconnecting the circuit elements in the group of circuit elements and connecting the circuit elements and the output terminal of the lookup table, and
wherein the selection circuit determines the number of NMOS transistors required to generate an output based on positioning of vias inserted among the M input terminals.

8. The semiconductor integrated circuit according to claim 7, wherein the number of NMOS transistors required to generate the output is determined based on locations of via insertions within a layer in relation to an input of each of the M input terminals.

* * * * *